(12) United States Patent
Canella et al.

(10) Patent No.: US 6,528,760 B1
(45) Date of Patent: Mar. 4, 2003

(54) APPARATUS AND METHOD USING ROTATIONAL INDEXING FOR LASER MARKING IC PACKAGES CARRIED IN TRAYS

(75) Inventors: Robert L. Canella, Nampa, ID (US); Tony T. Ibarra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 367 days.

(21) Appl. No.: 09/617,517

(22) Filed: Jul. 14, 2000

(51) Int. Cl.⁷ .......................... B23K 26/08; B65G 57/30
(52) U.S. Cl. ..................... 219/121.82; 219/121.68; 219/121.69; 414/798.1
(58) Field of Search ................ 219/121.68, 121.69, 219/121.82; 414/795.3, 788.7, 797.5, 798.1

(56) References Cited

U.S. PATENT DOCUMENTS

| | | |
|---|---|---|
| 2,357,600 A | 9/1944 | Pabst |
| 2,413,767 A | 1/1947 | Hyde |
| 2,454,548 A | 11/1948 | Brinkert |
| 2,495,541 A | 1/1950 | Nolan, Jr. |
| 3,239,218 A | 3/1966 | Reeves |
| 3,254,776 A | 6/1966 | Brown |
| 3,327,889 A | 6/1967 | Dore |
| 3,625,384 A | 12/1971 | Boerger et al. |
| 3,628,672 A | 12/1971 | Heinz |
| 3,774,352 A | 11/1973 | Weber |
| 3,799,017 A | 3/1974 | Halligan |
| 3,837,510 A | 9/1974 | McWilliams |
| 3,887,997 A | 6/1975 | Hartelroad et al. |
| 3,903,934 A | 9/1975 | Vizy |
| 3,917,983 A | 11/1975 | Kuronen |
| 3,937,386 A | 2/1976 | Hartleroad et al. |
| 3,969,813 A | 7/1976 | Minetti et al. |
| 3,973,665 A | 8/1976 | Giammanco |
| 4,024,545 A | 5/1977 | Dowling et al. |
| 4,030,622 A | 6/1977 | Brooks et al. |
| 4,058,217 A | 11/1977 | Vaughan et al. |

(List continued on next page.)

FOREIGN PATENT DOCUMENTS

| | | |
|---|---|---|
| CA | 843232 | 6/1970 |
| DE | 243 798 A1 | 3/1987 |
| EP | 0 653 791 A1 | 10/1994 |

(List continued on next page.)

OTHER PUBLICATIONS

Pending Patent Application "Automated Multi–Chip Module Handler, Method of Module Handling, and Module Magazine" (without claims or abstract), ser. no. 09/065,799, Filed Apr. 23, 1998.

Pending Patent Application "Method of Efficiently Laser Marking Singulated Semiconductor Devices" (without claims or abstrat), Ser. No. 08/590,919, Filed Jan. 24, 1996.

(List continued on next page.)

*Primary Examiner*—Geoffrey S. Evans
(74) *Attorney, Agent, or Firm*—TraskBritt

(57) ABSTRACT

An apparatus for laser marking IC packages carried in trays includes a transport actuator extending from an input shuttle assembly to an output shuttle assembly. The laser marking apparatus further includes a tray transport movable on the transport actuator and configured to receive a cooperatively configured tray carrier. The input shuttle assembly is adapted to load a tray carrying unmarked IC packages onto the tray carrier from a stack of trays on the input shuttle assembly. A tray bearing unmarked IC packages may travel on the tray carrier borne by the tray transport to a laser marking station positioned above the transport actuator and having a single laser marking head traversing one mark field disposed within an enclosure. A first portion of the IC packages disposed in the tray that are positioned in the mark field may be laser marked after the tray is lifted into the enclosure by a rotational lift mechanism located proximate the laser marking station.

56 Claims, 18 Drawing Sheets

U.S. PATENT DOCUMENTS

| | | |
|---|---|---|
| 4,095,095 A | 6/1978 | Muraoka et al. |
| 4,097,715 A | 6/1978 | Frizzi |
| 4,123,044 A | 10/1978 | Petzi |
| 4,178,531 A | 12/1979 | Alig |
| 4,203,486 A | 5/1980 | Rubbright et al. |
| 4,323,755 A | 4/1982 | Nierenberg |
| 4,346,284 A | 8/1982 | Grollimund et al. |
| 4,352,617 A | 10/1982 | Sakai |
| 4,353,796 A | 10/1982 | Kubo et al. |
| 4,354,770 A | 10/1982 | Block |
| 4,370,542 A | 1/1983 | Mills et al. |
| 4,375,025 A | 2/1983 | Carlson ............... 219/121.68 |
| 4,382,580 A | 5/1983 | Hellander |
| 4,403,134 A | 9/1983 | Klingel |
| 4,461,073 A | 7/1984 | Harringer et al. |
| 4,493,767 A | 1/1985 | Monteyne |
| 4,510,673 A | 4/1985 | Shils et al. |
| 4,517,436 A | 5/1985 | Lawrence |
| 4,534,695 A | 8/1985 | Stump et al. |
| 4,539,878 A | 9/1985 | Linker et al. |
| 4,543,716 A | 10/1985 | Damiano |
| 4,552,271 A | 11/1985 | Kranz |
| 4,577,563 A | 3/1986 | Sidler |
| 4,610,359 A | 9/1986 | Muller |
| 4,616,414 A | 10/1986 | Cushman |
| 4,626,656 A | 12/1986 | Ootsuka et al. |
| 4,630,513 A | 12/1986 | Keller |
| 4,638,144 A | 1/1987 | Latta, Jr. |
| D288,273 S | 2/1987 | Gould |
| 4,644,126 A | 2/1987 | Schumacher |
| 4,665,298 A | 5/1987 | La Rocca |
| 4,677,370 A | 6/1987 | Tustaniwskyj et al. |
| 4,696,096 A | 9/1987 | Green et al. |
| 4,711,334 A | 12/1987 | Barry et al. |
| 4,718,531 A | 1/1988 | Bianchi et al. |
| 4,767,984 A | 8/1988 | Bakker |
| 4,772,079 A | 9/1988 | Douglas et al. |
| 4,790,515 A | 12/1988 | Pocci |
| 4,791,267 A | 12/1988 | Yokoyama et al. |
| 4,818,835 A | 4/1989 | Kuwabara et al. |
| 4,832,612 A | 5/1989 | Grabbe et al. |
| 4,884,420 A | 12/1989 | Finkel et al. |
| 4,891,242 A | 1/1990 | Ito et al. |
| 4,914,269 A | 4/1990 | Kinsman et al. |
| 4,916,293 A | 4/1990 | Cartlidge et al. |
| 4,926,677 A | 5/1990 | Waldner |
| 4,944,492 A | 7/1990 | Nonaka |
| 4,947,981 A | 8/1990 | Dorner et al. |
| 4,965,829 A | 10/1990 | Lemelson |
| 4,965,927 A | 10/1990 | Holzman |
| H906 H | 4/1991 | Baggett et al. |
| 5,043,657 A | 8/1991 | Amazeen et al. |
| 5,090,664 A | 2/1992 | McCullough et al. |
| 5,102,291 A | 4/1992 | Hine |
| 5,113,992 A | 5/1992 | Sadamori |
| 5,117,963 A | 6/1992 | Thayer et al. |
| 5,127,837 A | 7/1992 | Shah et al. |
| 5,150,797 A | 9/1992 | Shibata |
| 5,177,368 A | 1/1993 | Kay |
| 5,204,987 A | 4/1993 | Klingel |
| 5,218,894 A | 6/1993 | College et al. |
| 5,219,765 A | 6/1993 | Yoshida |
| 5,226,361 A | 7/1993 | Grant et al. |
| 5,245,166 A | 9/1993 | Shepard |
| 5,245,900 A | 9/1993 | Dojnik |
| 5,256,578 A | 10/1993 | Corley et al. |
| 5,260,542 A | 11/1993 | Ishiguro et al. |
| 5,263,567 A | 11/1993 | Costa |
| 5,279,975 A | 1/1994 | Devereaux et al. |
| 5,290,134 A | 3/1994 | Baba |
| 5,302,798 A | 4/1994 | Inagawa et al. |
| 5,307,010 A | 4/1994 | Chiu |
| 5,313,156 A | 5/1994 | Klug et al. |
| 5,315,094 A | 5/1994 | Lisy |
| 5,322,173 A | 6/1994 | Kay |
| 5,332,463 A | 7/1994 | Eberlein et al. |
| 5,357,077 A | 10/1994 | Tsuruta ............... 219/121.68 |
| 5,360,747 A | 11/1994 | Larson et al. |
| 5,365,653 A | 11/1994 | Padrun |
| 5,375,320 A | 12/1994 | Kinsman et al. |
| 5,379,514 A | 1/1995 | Okuda et al. |
| 5,399,828 A | 3/1995 | Riddle et al. |
| 5,402,563 A | 4/1995 | Satoh et al. |
| 5,427,349 A | 6/1995 | Obrecht |
| 5,458,158 A | 10/1995 | Kawanabe |
| 5,463,227 A | 10/1995 | Stern et al. |
| 5,465,470 A | 11/1995 | Vongfuangfoo et al. |
| 5,466,908 A | 11/1995 | Hosoya et al. |
| 5,467,023 A | 11/1995 | Takeyama |
| 5,479,694 A | 1/1996 | Baldwin |
| 5,481,202 A | 1/1996 | Frye, Jr. |
| 5,487,471 A | 1/1996 | Marchek et al. |
| 5,498,851 A | 3/1996 | Hayashi et al. |
| D371,021 S | 6/1996 | Pine et al. |
| 5,566,414 A | 10/1996 | Nonaka |
| 5,566,840 A | 10/1996 | Waldner et al. |
| 5,587,094 A | 12/1996 | Yoshida et al. |
| 5,588,797 A | 12/1996 | Smith |
| 5,600,150 A | 2/1997 | Stern et al. |
| 5,605,641 A | 2/1997 | Chiba et al. |
| 5,629,484 A | 5/1997 | Liska |
| 5,632,083 A | 5/1997 | Tada et al. |
| 5,632,915 A | 5/1997 | Schnetzer et al. |
| 5,638,958 A | 6/1997 | Sanchez |
| 5,643,477 A | 7/1997 | Gullo et al. |
| 5,653,900 A | 8/1997 | Clement et al. |
| 5,654,204 A | 8/1997 | Anderson |
| 5,665,609 A | 9/1997 | Mori |
| 5,691,544 A | 11/1997 | Stern et al. |
| 5,717,162 A | 2/1998 | Matsuoka |
| 5,719,372 A | 2/1998 | Togari et al. |
| 5,722,639 A | 3/1998 | Nonaka |
| 5,761,301 A | 6/1998 | Oshima et al. ............... 380/4 |
| 5,793,051 A | 8/1998 | Stern et al. |
| 5,808,268 A | 9/1998 | Balz et al. |
| 5,821,497 A | 10/1998 | Yamazaki et al. ...... 219/121.69 |
| 5,829,115 A | 11/1998 | Speller, Jr. et al. |
| 5,838,431 A | 11/1998 | Hara et al. |
| 5,870,820 A | 2/1999 | Arakawa et al. |
| 5,875,544 A | 3/1999 | Chou |
| 5,909,706 A | 6/1999 | Jin et al. |
| 5,911,461 A | 6/1999 | Sauter et al. |
| 5,932,119 A | 8/1999 | Kaplan et al. |
| 5,937,270 A | 8/1999 | Canella ............... 219/121.8 |
| 5,942,136 A | 8/1999 | Mori et al. |
| 5,946,791 A | 9/1999 | Baldwin |
| 5,966,307 A | 10/1999 | Lin |
| 5,985,377 A | 11/1999 | Corbett |
| 5,986,235 A | 11/1999 | Canella |
| 5,991,245 A | 11/1999 | Yoshimura |
| 5,999,252 A | 12/1999 | Greisz ............... 356/138 |
| 6,008,476 A | 12/1999 | Neiconi et al. |
| 6,023,042 A | 2/2000 | Hensel et al. |
| 6,031,202 A | 2/2000 | Arakawa et al. ...... 219/121.68 |
| 6,062,119 A | 5/2000 | Overgaard |
| 6,070,731 A | 6/2000 | Kobayashi et al. |
| 6,131,721 A * | 10/2000 | Arakawa et al. |
| 6,138,542 A | 10/2000 | Overgaard |
| 6,241,459 B1 * | 6/2001 | Canella et al. |
| 6,262,388 B1 * | 7/2001 | Canella et al. ...... 219/121.68 |
| 6,417,484 B1 * | 9/2002 | Canella et al. ...... 219/121.68 |

FOREIGN PATENT DOCUMENTS

| | | | |
|---|---|---|---|
| EP | 0 653 791 | 5/1995 | |
| FR | 1.284.603 | 1/1961 | |
| JP | 57-53955 | 3/1982 | |
| JP | 61-297047 | 12/1986 | |
| JP | 62-244591 | 10/1987 | |
| JP | 63171714 | 7/1988 | |
| JP | 63-202521 | 8/1988 | ............. 414/788.4 |
| JP | 1-100677 | 4/1989 | |
| JP | 2-205281 | 8/1990 | |
| JP | 4-066416 | 3/1992 | |
| JP | 5-69164 | 3/1993 | |
| JP | 6-226472 | 8/1994 | |
| JP | 06314899 A | 11/1994 | |
| JP | 6-326203 | 11/1994 | |

OTHER PUBLICATIONS

Pending Patent Application, "Shuttle Assembly for Tray Handling" (without claims or abstract), Ser. No. 09/219,501, Filed Dec. 21, 1998.

Pending Patent Application, "Controlled Motion Lift Mechanism" (without claims or abstract), Ser. No. 09/217,032, filed Dec. 21, 1998.

Pending Patent Application, "Self–Aligning Tray Carrier Apparatus with Tilt Feature" (without claims or abstract), Ser. No. 09/217,029, filed Dec. 21, 1998.

Pending pat. application "An Apparatus for Actuating the Retaining Locks of a Cassette" (without claims or abstract), Ser. No. 08/923,359, filed Sep. 8,1997.

Pending pat. application, "Integrated Circuit Chip Handling Apparatus and Method" (without claims or abstract), Ser. No. 09/307,498.

* cited by examiner

APPARATUS AND METHOD USING ROTATIONAL INDEXING FOR LASER MARKING IC PACKAGES CARRIED IN TRAYS

CROSS-REFERENCE TO RELATED APPLICATIONS

This application is related to U.S. patent applications Ser. Nos. 09/217,040; 09/219,501; 09/217,032; 09/217,029; and 09/217,039 by the same inventors, all filed on Dec. 21, 1998.

BACKGROUND OF THE INVENTION

This invention relates generally to marking of semiconductor dice bearing integrated circuits and, more specifically, to a system for laser marking exterior surfaces of dice carried in large groups on trays and a method of system operation.

Since the first packaged integrated circuits became commercially available, manufacturers have often found it necessary to identify packaged ICs by marking each IC or packaged assembly of ICs with the manufacturer's name, a part or serial number, or other identifying information such as a lot number or a wafer and/or die location. As the majority of ICs are packaged individually in a transfer-molded filled polymer compound, most current marking systems have been developed for this type of IC packaging.

Manufacturers initially marked packaged ICs using mechanical ink transferring devices, such as stamps or rollers, with or without stencils, to transfer ink to the surface of an IC. One example of an ink-marking apparatus is disclosed in U.S. Pat. No. 5,226,361 to Grant et al. Because of the mechanical nature of the process and the drying time associated with ink, ink stamping systems are relatively slow and the applied ink susceptible to smudging. Also, the quality of ink-stamped marks on packaged ICs can vary substantially over time and from IC to IC due to variations in the quality and quantity of ink applied, ambient temperature and humidity, and the condition and finish of the surface of the stamp and the package.

Because of the deficiencies associated with ink stamping, manufacturers have in recent years switched to using a laser beam to mark the surface of a packaged IC. Unlike ink stamping, laser marking is very fast, requires no curing time, produces a consistently high-quality mark, and can take place at any point in the manufacturing process.

Various machines and methods have been developed for marking ICs with a laser. As illustrated in U.S. Pat. No. 5,357,077 to Tsuruta, U.S. Pat. No. 4,945,204 to Nakamura et al., U.S. Pat. No. 4,638,144 to Latta, Jr., and U.S. Pat. No. 4,375,025 to Carlson, a packaged IC is placed in a position where a laser beam, such as that produced by a carbon dioxide or neodymium-yttrium-aluminum garnet laser, inscribes various characters or other information on a package surface. The laser beam burns away a small amount of material on the surface of the IC package so that the area where the characters are to appear has a different reflectivity from the rest of the package surface. By holding the packaged IC at a proper angle to a light source, the characters inscribed on the device by the laser can be read.

U.S. Pat. No. 5,937,270 to Canella, one of the present inventors, assigned to the assignee of the present invention and incorporated herein by this reference, discloses yet another laser marking system which is operable at high throughput volumes and makes substantially constant use of a marking laser by use of a multi-track IC feed, marking and inspection procedure. While highly successful, the laser marking system of the '270 patent feeds singulated, packaged ICs from tubular magazines along two parallel, inclined tracks to a marking zone, after which the marked devices are then automatically inspected and either discarded or re-loaded into other tubular magazines at the output ends of the tracks.

Recently developed IC packages, however, are now much reduced in size, thickness and dimensions of individual features, such as leads for external connection to higher level packaging. One example of such state-of-the-art IC packages is a thin plastic package configuration identified as a Thin Small Outline Package, or TSOP. Another is a Thin Quad Flat Pack, or TQFP. By way of comparison, such packages are dimensioned with a total package thickness, excluding lead fingers, of less than about one-half the thickness of a conventional plastic Small Outline J-lead package, or SOJ, such as would be marked in the above-described system of the '270 patent. These newer IC packages, with their smaller dimensions and more fragile components, are much more susceptible to inadvertent damage in handling than prior package designs and, at best, are only marginally robust enough for handling in tubular magazines and by singulated feed-through processing equipment. As a result, the industry has gravitated to processing such relatively delicate IC packages in batches carried in recesses of rectangular trays, one example of which are so-called JEDEC trays. Other, even smaller IC packages under current development and most recently introduced to the market include so-called "chip-scale" IC packages. These packages, having dimensions approximating those of a bare IC die itself and employing extremely minute external connection elements, also are desirably handled in trays. It is contemplated that such chip-scale packages may be desirably laser marked on the bare or thinly coated back side of the die itself in instances where packaging is largely intended to protect and seal the active surface at the die sides and primarily extends over the sides and active (front) surface of the die. Accordingly, as used herein, the terms "IC package", "packaged IC" or "IC" include not only conventional polymer-encapsulated dice, but any dice incorporating sufficient structure to effect operative connection to a higher level package, such as a circuit card, or to another die.

In addition to the aforementioned difficulties with marking thin, reduced-dimension IC packages using tubular magazines and inclined tracks, feeding and marking singulated IC packages, even when grouped for marking, is time consuming and fraught with potential for workpiece jamming somewhere on the tracks. Further, such an approach requires numerous sensors to verify passage of individual IC packages, location of individual IC packages for marking and inspection, counting of IC packages to ensure full output magazines, prevention of magazine overfilling and jamming, and the handling equipment for the same. Further, movable stops are required to locate and release the IC packages at numerous locations and so, along with the proliferation of sensors, necessitate a somewhat complex and relatively expensive control apparatus for reliable system operation.

Another disadvantage of conventional laser marking systems lies in a safety requirement that the IC packages be enclosed in a laser light-secure enclosure to prevent injury to personnel from the laser beam. Such conventional laser marking systems employ a workpiece path extending in a single plane through the marking station, thus requiring movable access shutters which must be manipulated, resulting in additional system cost and reducing throughput due to the time lost in opening and closing the shutters for entry and exit of groups of IC packages, as well as adding another timed operation to the sequence of events in the marking process.

While trays facilitate moving large batches of packaged ICs while minimizing the risk of physical damage from handling, a problem with using trays to carry IC packages for marking is the need to deal with a wide range of tray-to-part tolerances. Thus, it would be necessary to orient the IC packages in the tray recesses to a common corner of each tray pocket to obtain a repeatable marking of all the IC packages in the tray. It would also be necessary to ensure that trays carrying IC packages are received in various handling and processing mechanisms in the correct orientation, so that the IC packages themselves will be properly oriented.

Another problem encountered with the laser marking of ICs carried in trays is that standard trays are typically larger than the mark field of a single laser marking head. For example, a laser marking head typically includes a single laser capable of marking within a 6 inch by 6 inch field. However, a typical tray for handling IC packages, such as the JEDEC tray, comprises a 12 inch by 6 inch array of ICs. Thus, a tray having a 12 inch by 6 inch array of packaged ICs must be indexed twice with respect to the 6 inch by 6 inch mark field of the laser marking head in order to mark all ICs on the tray.

One method of compensating for the limited mark field of a single laser marking head is to employ a second laser in the laser marking head, the second laser having its own distinct mark field. Another method of compensating for the limited mark field of a single laser marking head, as disclosed in related patent application Ser. No. 09/217,040, the disclosure of which is hereby incorporated herein by reference, is to use a beam splitter to bifurcate the beam of the single laser into two separate beams, each of the two separate beams capable of moving within its own unique mark field. For example, a single laser marking head may have a beam splitter dividing the beam into two separate beams, a first beam traversing a 6 inch by 6 inch mark field and a second beam traversing another 6 inch by 6 inch mark field. Therefore, all of the IC packages carried on a 12 inch by 6 inch tray may be laser marked during a single pass underneath the laser marking head.

Although a laser marking head incorporating multiple lasers, or one using a beam splitter in conjunction with a single laser, may overcome the limitations of a single laser marking head having only a 6 inch by 6 inch mark field, incorporation of either an additional laser or a beam splitter into a laser marking head significantly increases the overall system cost. In contrast, laser marking heads including a single laser traversing only one mark field—for example, the 6 inch by 6 inch mark field—are much less costly and are readily available on the market. However, as previously indicated, laser marking IC packages carried in trays using a single laser marking head with a small mark field requires that each tray be indexed longitudinally at least twice to mark all ICs carried on the tray. Each additional indexing step increases production time and also increases the likelihood that alignment errors between the laser beam and a tray—and a plurality of ICs carried thereon—will develop.

Accordingly, there is a need in the art for a mechanically and electrically straightforward laser marking system for use with tray-based IC handling systems that is configured for use with low-cost single laser marking heads currently available on the market. Further, there is a need in the art for such a laser marking system that provides accurate, repeatable, and high-speed indexing of a tray with respect to the mark field, while also providing high and reliable throughput of marked IC packages.

BRIEF SUMMARY OF THE INVENTION

The present invention includes a tray-based laser marking system providing accurate and repeatable high-speed rotational indexing of a tray and the IC packages carried thereon.

In one embodiment of the present invention, the laser marking system includes a laser marking station having a walled, open-bottomed enclosure and a rotational lift mechanism associated therewith for insertion, rotational indexing, and withdrawal of a tray carrier bearing a tray of unmarked IC packages relative to the open-bottomed enclosure of the laser marking station. The laser marking station houses a single laser marking head within the open-bottomed enclosure. The open-bottomed enclosure of the laser marking station defines an opening into which the tray carrier, bearing a tray of IC packages to be marked, may be raised and indexed by the rotational lift mechanism to place the tray at correct laser focal length and to effect complete (laser) light containment within the enclosure using the tray carrier to effect closure of the opening.

In another embodiment of the present invention, the rotational lift mechanism comprises a vertical lift mechanism, a rotary actuator assembly, and a tray manipulator. The tray manipulator is configured to engage a tray carrier, and a tray bearing IC packages supported thereon, so that the tray carrier may be manipulated with respect to the laser marking station. The rotary actuator assembly includes a rotary actuator having an output shaft secured to the tray manipulator to effect rotation of the tray manipulator, and a tray carrier engaged therewith, relative to the laser marking station. Thus, the rotary actuator assembly provides for rotational indexing of a tray carried by the tray carrier relative to the mark field of the laser marking head. The rotary actuator assembly is secured to the vertical lift mechanism, which may be a wedge-type lift mechanism as hereinafter described, such that the tray manipulator may be moved vertically with respect to the laser marking station.

A further embodiment of the invention includes a method of operation of the laser marking system of the invention.

DETAILED DESCRIPTION OF THE INVENTION

Figure 1:
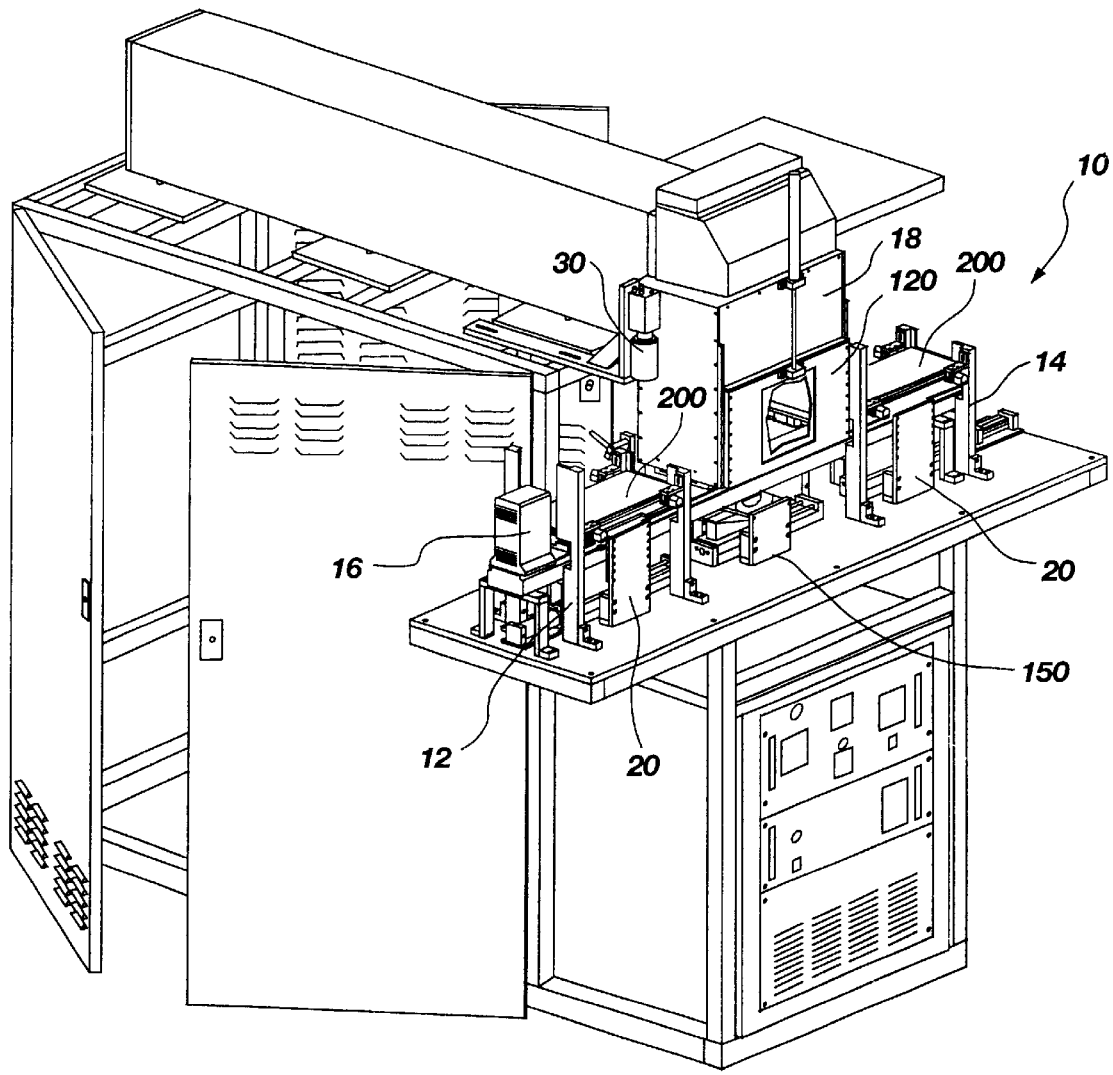
FIG. 1 of the drawings comprises a perspective view of a laser marking system according to one embodiment of the present invention.
Figure 2:
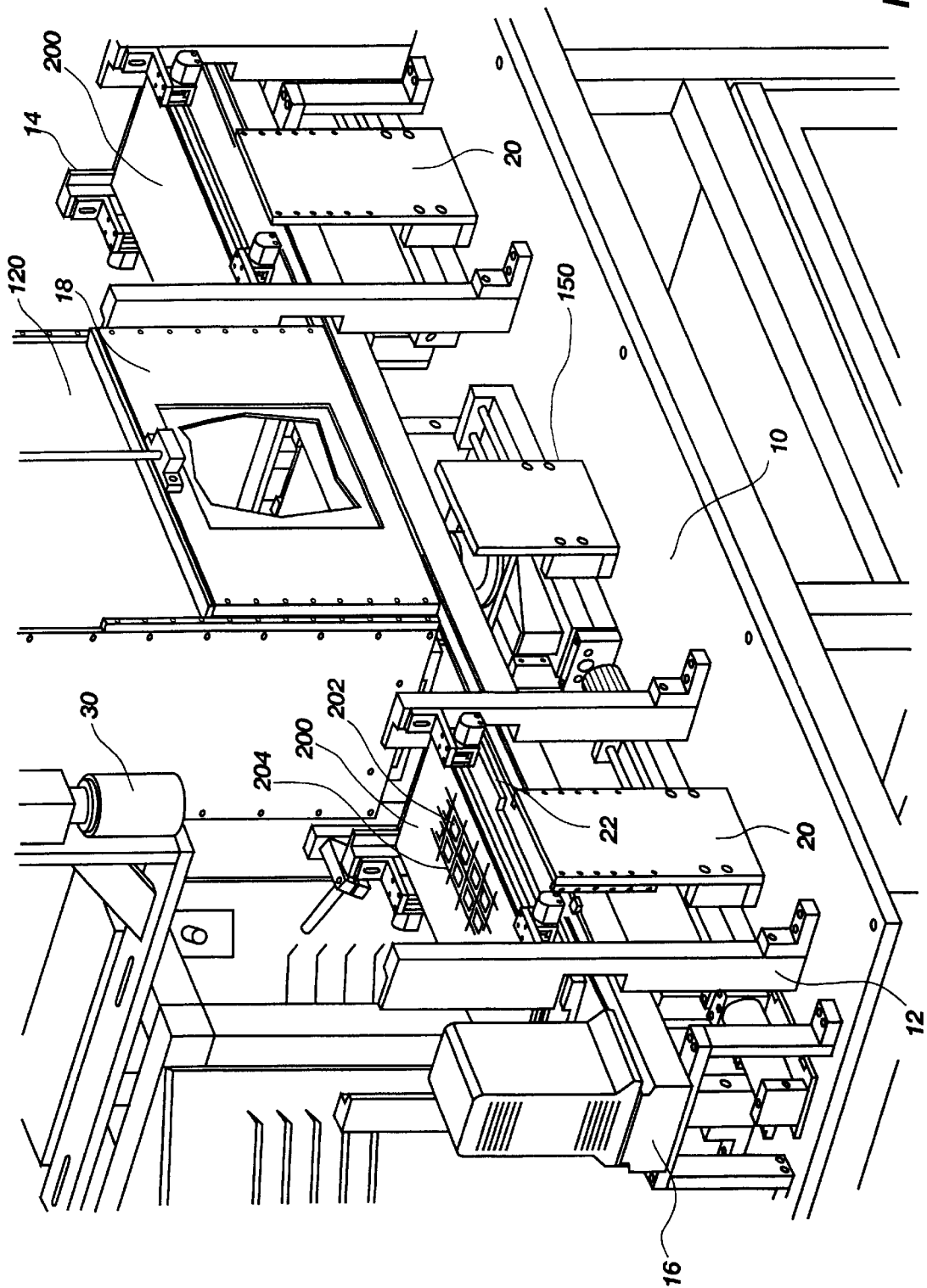
FIG. 2 comprises an enlargement of a central portion of FIG. 1.

Referring now to FIGS. 1 and 2 of the drawings, laser marking system 10 includes an input shuttle assembly 12, an output shuttle assembly 14, and a transport actuator 16 extending horizontally therebetween. The transport actuator 16 extends under laser marking station 18. A rotational lift mechanism 150 is located beneath the laser marking station 18. Two other lift mechanisms 20 are located respectively in vertical alignment with input shuttle assembly 12 and output shuttle assembly 14.

A plurality of vertically stacked trays 200 are depicted at both input shuttle assembly 12 and output shuttle assembly 14, the structure and operation of each shuttle assembly being described in more detail below. Also depicted (see FIG. 2) is a tray carrier 22 on which a singulated tray 200, carrying a plurality of packaged ICs 202 in a rectangular array of recesses 204 (only some shown for clarity) comprising rows and columns, may be moved on a tray transport 24 (see FIGS. 4–6) of transport actuator 16 from input shuttle assembly 12 to output shuttle assembly 14. Tray transport 24 may be precisely rotationally aligned with the longitudinal path defined by transport actuator 16 using Allen-type T-nuts which secure tray transport 24 to the carriage of transport actuator 16.

A downwardly aimed inspection camera 30, as shown on the upstream side of laser marking station 18, may be employed to verify pin-one location and thus proper orientation for the packaged ICs 202 in a tray 200 passing thereunder on tray carrier 22, as well as part-in-tray verification to ensure that each tray 200 is fully loaded with packaged ICs 202 for marking. A similar camera 30 on the downstream side of laser marking station 18 may be employed to verify the presence of laser markings on each packaged IC 202 of a tray 200 which has been processed in laser marking station 18. A tray 200 may be stopped twice (and moved a half-tray length between stops) under downstream camera 30 for mark inspection, as packaged ICs 202 in each longitudinal half of each tray 200 are marked in the same mark field by a single laser marking head of laser marking station 18 during separate marking operations. Marking of the last IC package marked in each longitudinal tray-half may be checked on the logical premise that satisfactory marking of the last package would not take place if any failure in the laser or beam control circuitry had previously occurred. This sampling approach to inspection achieves the required quality assurance for the marking process with a substantial time savings over inspecting every marked IC package. High-intensity lights (not shown) may be provided at the two camera locations to facilitate inspection.

Transport actuator 16 may comprise an IA Corporation Model 12EX-35-100 Intelligent Actuator, a 1000 mm programmable stepper. Transport actuator 16 may be programmed (by way of example only and not limitation) for use with laser marking system 10 to six (6) positions: tray input, tray check (pin-one location and part-in-tray verification), laser marking, dual mark check (one for each half of the tray, as described above) and tray output. This particular approach to transporting a tray carrier 22 was selected due to the precise longitudinal positional accuracy provided at each position. Other, alternative approaches to tray transport providing equivalent positional accuracy may be employed instead.

Figure 3:
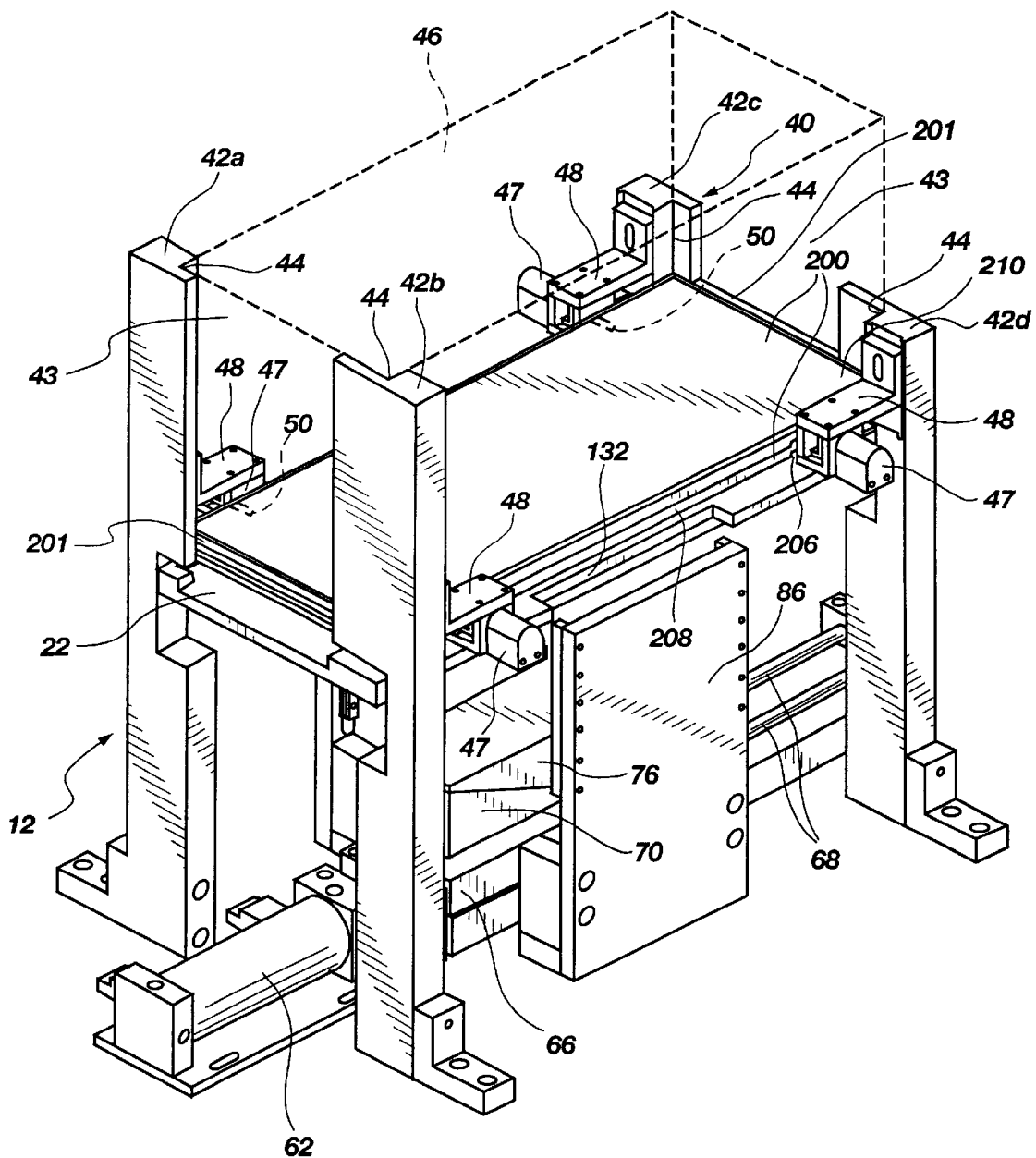
FIG. 3 is an enlarged perspective view of a tray shuttle usable with the present invention.

Input shuttle assembly 12 and output shuttle assembly 14 as depicted in FIGS. 1 and 2 are substantially identical. FIG. 3 shows an enlargement of the portion of FIG. 2 depicting input shuttle assembly 12 and with transport actuator 16 removed for clarity. Input shuttle assembly 12 includes a frame 40 comprising four frame members 42a–d, each having a vertically extending notch 44 facing a rectangular tray stack volume 46 shown in broken lines. Frame members 42a and 42b extend upwardly a greater distance than frame members 42c and 42d and define the uppermost vertical height limit for a stack of trays 200, two of which trays 200 being shown. As can readily be seen in FIG. 3, a distance or depth within a notch 44 from a corner of tray stack volume 46 to a laterally inward edge of each of frame members 42a and 42c is smaller than a distance or depth from a corner of tray stack volume 46 to a laterally inward edge of each of frame members 42b and 42d. Further, there is a laterally extending gap 43 between frame members 42a and 42b, and there is a like-sized gap 43 between frame members 42c and 42d. Protrusions 201 at each end of a tray 200 are sized and located on each end of the tray 200 to lie within gaps 43 when the tray 200 is located in tray stack volume 46, so that the input shuttle assembly 12 is "keyed" to only accept trays 200 in the proper rotational orientation. In other words, the frame will not accept a tray 200 placed "backward" in tray stack volume 46. Thus, the packaged ICs 202 in each tray 200 will be in a proper orientation for marking.

Each frame member 42a–d supports a tray support element actuator 47 on a height-adjustable bracket 48. Tray support element actuators 47 may comprise air (pneumatic) cylinders which, when actuated, retract a tab-like tray support element 50. Each tray support element 50 is—when a corresponding tray support element actuator 47 is not actuated—spring-biased inwardly to intersect a boundary of tray stack volume 46. The tray support elements 50 are each located in their extended positions to enter one of four downwardly facing notches 206 in the sides 208 of a tray 200 proximate a tray corner 210. Thus, one or more trays 200 may be supported at four locations within tray stack volume 46. Further, if air pressure to tray support element actuators 47 is lost, any trays 200 within stack volume 46 above tray support elements 50 are kept from falling. Tray support element actuators 47 may comprise Myotoku Ltd. TKY-H-8X4 air cylinders.

Figure 4:
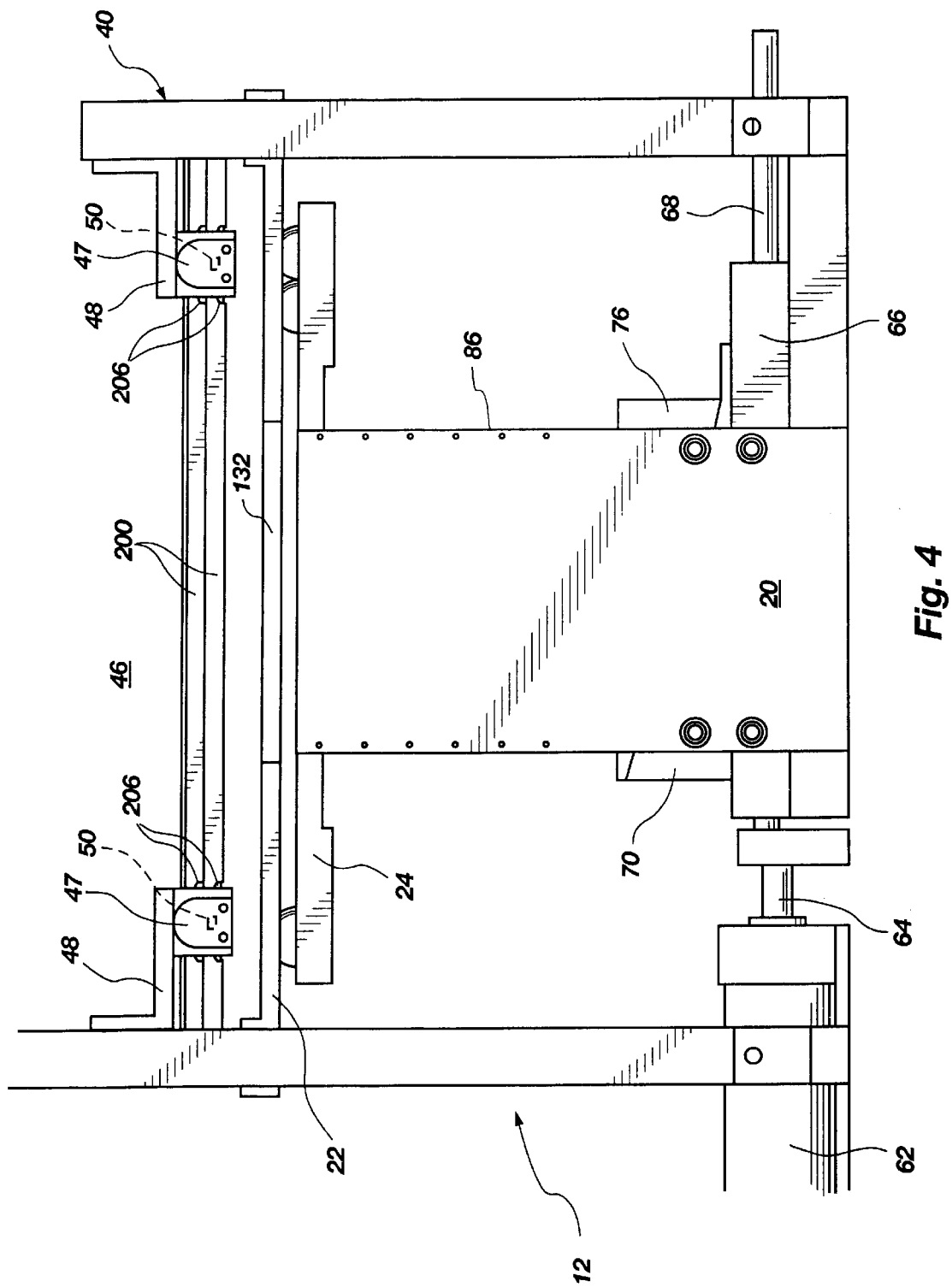
FIGS. 4–6 are side elevations of the tray shuttle assembly of FIG. 3 in various positions.
Figure 5:
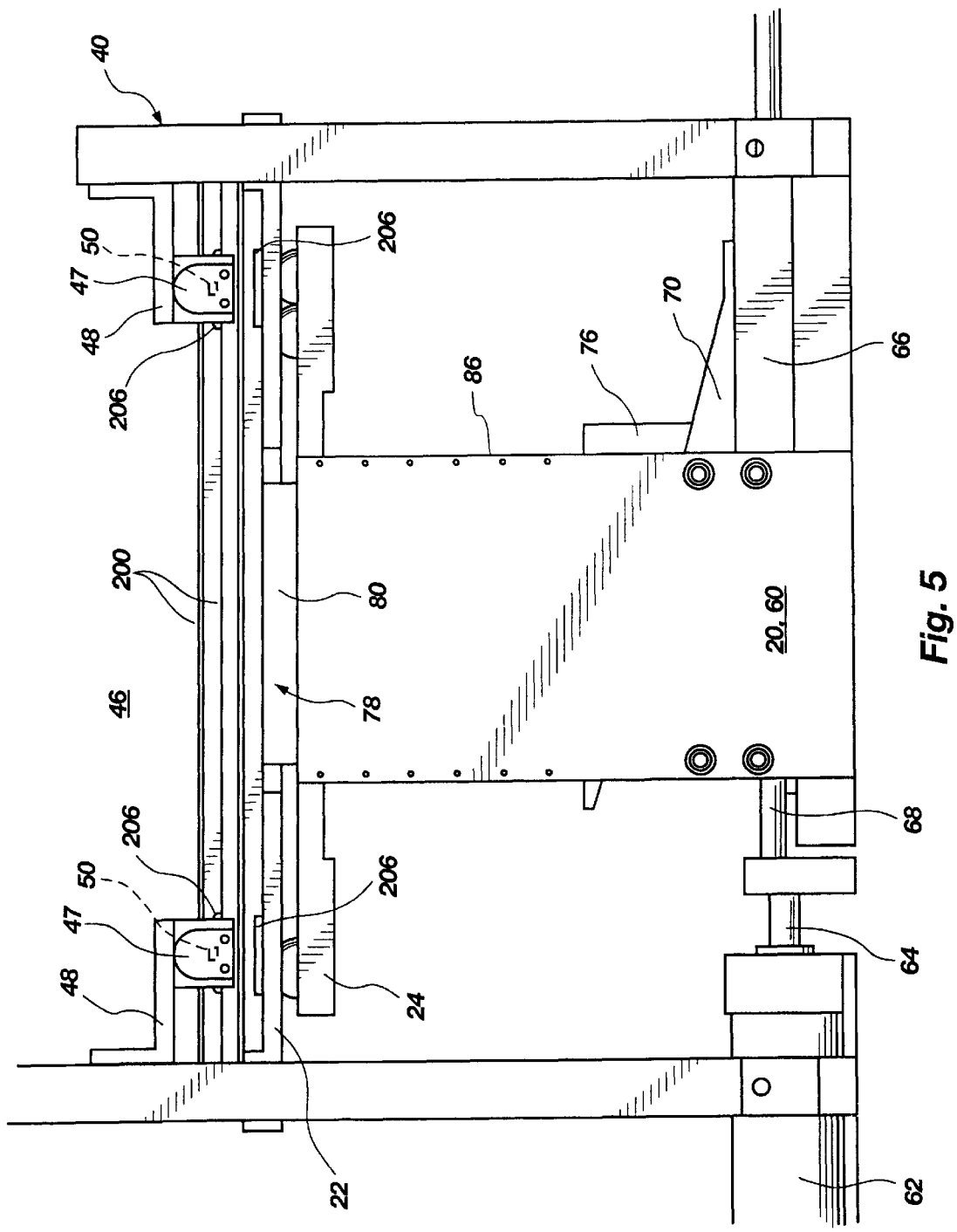
Figure 6:
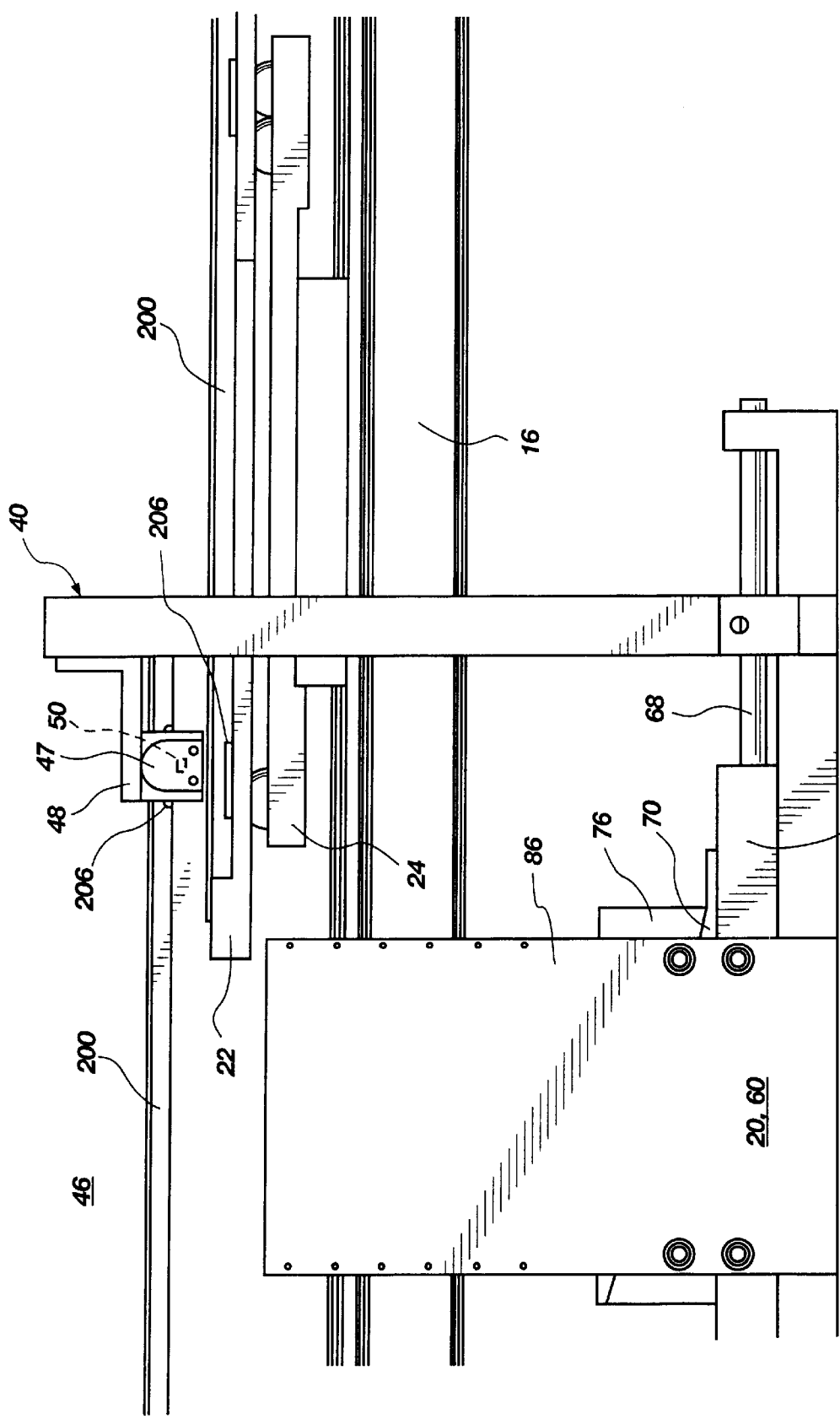

Tray carrier 22 is depicted under tray stack volume 46 in FIG. 3 in position to receive a tray 200 lowered thereon. FIGS. 4–6 depict a tray unload sequence. A tray transport 24 bearing a tray carrier 22 is located initially (see FIG. 4) under tray stack volume 46 of input shuttle assembly 12 out of contact with lowermost tray 200. Parallel side plates 80 (see FIG. 5) of a lift structure 78 of a wedge-type lift mechanism 60, as described below, are vertically extended through elongated side notches 132 of tray carrier 22 to supportingly engage the bottom of lowermost tray 200 and to support all of the trays in tray stack volume 46. At this point, tray support element actuators 47 are initiated to withdraw tray support elements 50. As shown in FIG. 5, lowermost tray 200 is then lowered on side plates 80 of lift structure 78 a vertical distance (for example, 0.25 inch) equal to the thickness of each tray 200, tray support element actuators 47 deactivated to extend tray support elements 50 into downwardly facing notches 206 of the next highest tray 200, and then lowermost tray 200 further lowered onto tray carrier 22. Tray carrier 22 carrying lowermost tray 200 is then moved horizontally out from under tray stack volume 46 on tray carrier 22 and tray transport 24, as shown in FIG. 6, and toward laser marking station 18.

In unloading trays 200 from tray carrier 22 at output shuttle assembly 14 after passage through laser marking station 18, the tray carrier 22 carrying a tray 200 of marked ICs 202 is aligned with tray stack volume 46 of output shuttle assembly 14. Side plates 80 of a lift structure 78 of a wedge-type lift mechanism 60 are then vertically extended through elongated side notches 132 of the tray carrier 22 to raise that tray 200 into supporting contact with a lowermost (or only) tray 200 already in tray stack volume 46 and supported by tray support elements 50 of output shuttle assembly 14. Tray support element actuators 47 are then initiated to retract tray support elements 50 and the stack of trays 200 is lifted the thickness of one tray 200 (again, for example, 0.25 inch). Tray support element actuators 47 are then deactivated to extend tray support elements 50 into downwardly facing notches 206 of the lowermost tray 200 just lifted from tray carrier 22 and to support the stack of trays 200. Of course, if there are no trays at output shuttle assembly 14 when a tray carrier 22 bearing a tray 200 arrives, the sequence will be the same. After side plates 80 are vertically withdrawn below the level of tray carrier 22 on tray transport 24, tray carrier 22 is returned on tray transport 24 to input shuttle assembly 12 to receive another tray 200 of unmarked packaged ICs 202.

Figure 7:
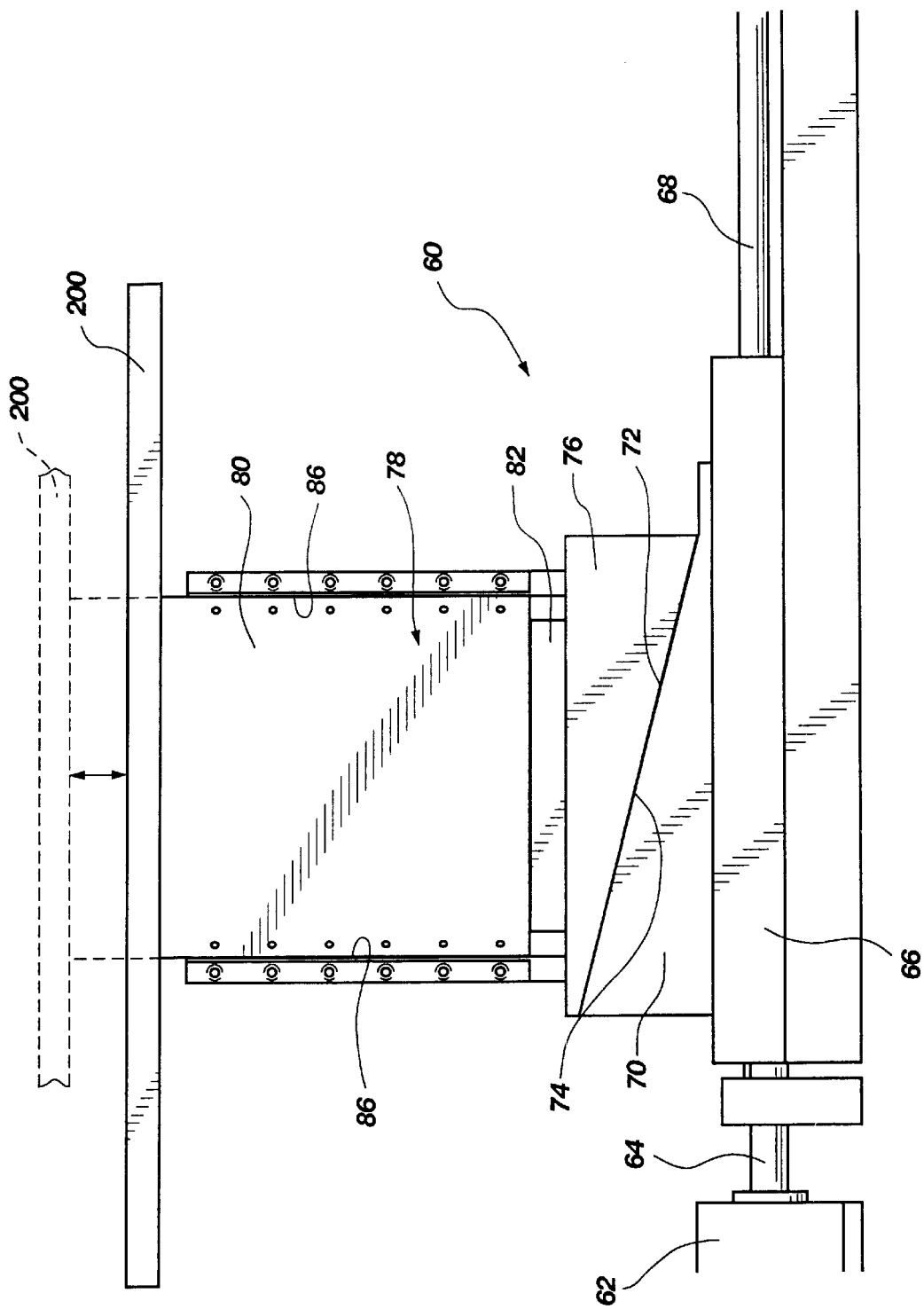
FIGS. 7–9 are side, partial sectional elevations of a wedge-type lift mechanism usable with the present invention, in various positions.
Figure 8:
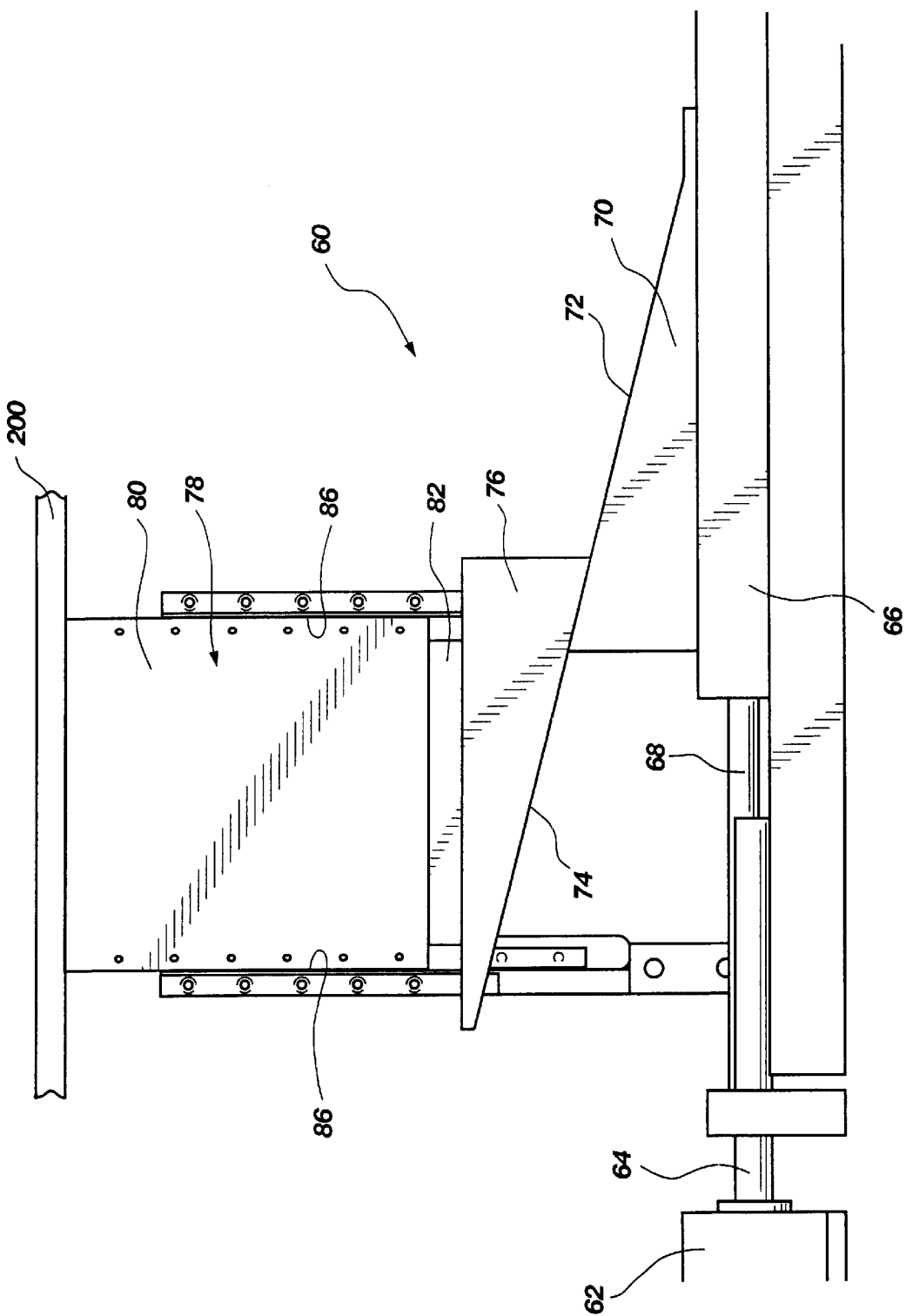
Figure 9:
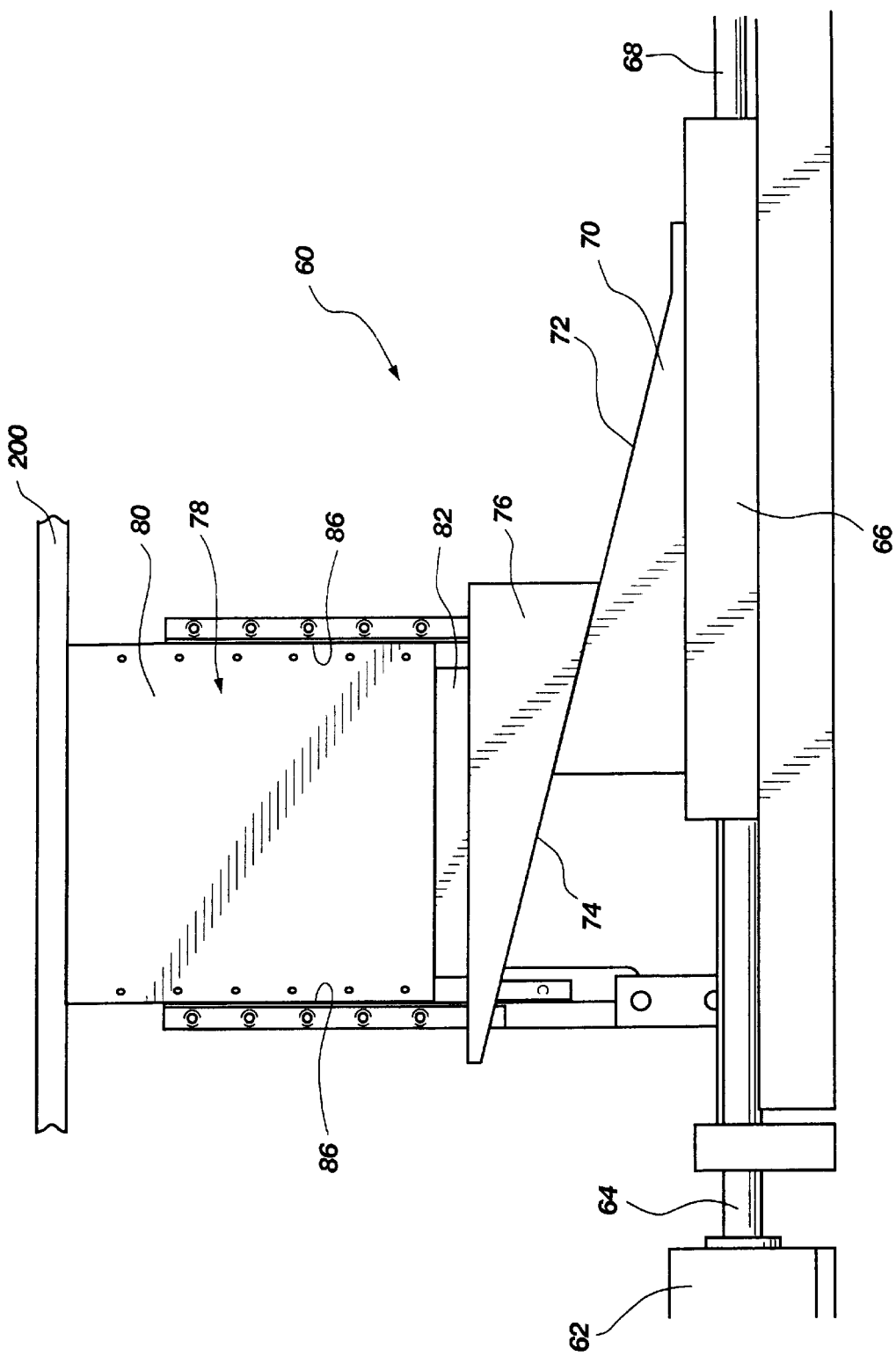

A significant feature of the laser marking system 10 is a particular wedge-type lift mechanism 60 (located as noted by reference numerals 20 on the previously referenced drawing figures) as depicted in various positions in FIGS. 7–9. In the embodiment illustrated, lift mechanism 60 is employed with input shuttle assembly 12 and output shuttle assembly 14. The rotational lift mechanism 150 may also include a wedge-type lift mechanism.

Lift mechanism 60 includes a horizontally oriented stop dual-action (i.e., positive bidirectional actuation) air cylinder 62, which may comprise a Parker Series S pneumatic cylinder. Shaft 64 of cylinder 62 is extendable and retractable under air pressure to selectively provide a stop for dual-action, pneumatically-actuated drive block 66 riding on dual parallel horizontal guide shafts 68. Drive wedge element 70 carried on drive block 66 and secured thereto has an upper inclined surface 72 upon which is supported lower inclined surface 74 of slave wedge element 76. Slave wedge element 76 is constrained against horizontal movement by attachment to a three-sided lift structure 78 comprising vertically extending side plates 80 and horizontal floor 82. Side plates 80 are contained and guided by linear bearings 86 so as to permit only vertical movement.

As drive block 66 moves horizontally, such movement is translated into vertical movement of the lift structure 78 by movement of the upper inclined surface 72 of drive wedge element 70 against lower inclined surface 74 of slave wedge element 76. Due to the angle of inclination of surfaces 72 and 74, horizontal motion results in reduced vertical motion (by, for example, a 4:1 horizontal to vertical ratio) but increased force over the smaller vertical distance as well as a smoother vertical movement of lift structure 78, reducing any shock of contact of lift structure 78 with a tray 200. Furthermore, the control system for the lift mechanism 60, since it involves control of only two dual-action air cylinders, is extremely simple compared to conventional stepper or servo controls.

The lift mechanism 60 with air cylinder 62 and drive block 66 may be manipulated to move in a vertical increment equal to the thickness of trays 200, as alluded to above. Such manipulation is possible due to the difference in travel between shaft 64 of air cylinder 62, which may be either three inches or one inch in the disclosed embodiment as explained below, and drive block 66, which is four inches in the disclosed embodiment. Further, air cylinder 62 is sized to generate substantially more force than drive block 66, so that actuation of air cylinder 62 in opposition to drive block 66 precludes further movement of drive block 66 upon contact with shaft 64. Stated alternatively, the shaft 64 of air cylinder 62 may be selectively extended to act as a stop to full horizontal travel of drive block 66 and thus provide the lift mechanism 60 with a vertical position between fully extended and fully retracted.

The uppermost vertical position of lift structure 78 of the lift mechanism 60 may obviously be designed in light of the level to which a tray 200 must be lifted. For example, when used with both input shuttle assembly 12 and output shuttle assembly 14, the uppermost vertical position of lift structure 78 (in this instance, 1.00 inch elevation) would be in supporting contact with the lowermost tray 200 in tray stack volume 46. When used with input shuttle assembly 12, the uppermost vertical position is used to supportingly engage the lowermost tray in tray stack volume 46, permitting retraction of tray support elements 50. When used with output shuttle assembly 14, the uppermost vertical position of lift structure 78 would be the same (1.00 inch) as for input shuttle assembly 12, that is, one tray thickness (i.e., 0.25 inch) higher than the bottom of the lowermost tray 200 in the tray stack volume 46. Thus, a tray 200 full of marked IC packages 202 may be raised by lift structure 78 into lifting contact with the lowermost tray of a stack of trays 200, so that notches 206 of the tray 200 being lifted are above the tray support elements 50, enabling the tray 200 being lifted from the tray carrier 22 (and trays 200 thereabove in the stack) to be supported by extended tray support elements 50. Tray transport 24 with tray carrier 22 may then be returned to input shuttle assembly 12 to receive another tray 200.

As shown in FIGS. 7–9, with specific reference to a lift mechanism for an input shuttle assembly 12, a lift mechanism 60 as described may be programmed to one of several vertical positions over a total travel of 1.00 inch, including a zero elevation position wherein lift structure 78 is completely retracted out of contact with a tray 200 when the tray 200 rests on tray carrier 22 on tray transport 24 carried by transport actuator 16. For example, and with specific reference to FIG. 7, the lowermost vertical position of lift mechanism 60 (and, therefore, of lift structure 78) is achieved when air cylinder 62 is actuated to withdraw shaft 64 to the left as shown in FIG. 7, while drive block 66 is similarly moved to the left so that slave wedge element 76 is substantially superimposed over drive wedge element 70.

In order to raise lift structure 78 to its uppermost vertical position as shown in FIG. 8, to, for example, receive a tray 200 from input shuttle assembly 12, drive block 66 is actuated to move its full horizontal travel (four inches) to the right, yielding 1.00 inch of lift travel. At the same time, or subsequent to movement of drive block 66, air cylinder 62 may be actuated to drive shaft 64 its full horizontal travel (three inches) to the right in preparation for the next movement sequence of lift mechanism 60. After a tray 200 at the bottom of a tray stack in input shuttle assembly 12 is contacted by side plates 80 of lift structure 78 and tray support elements 50 retracted as previously described, drive block 66 is positively actuated to move to the left. However, contact with extended shaft 64 of air cylinder 62 as shown in FIG. 9, prevents further leftward movement of drive block 66, resulting in a downward vertical movement of lift structure 78 of only 0.25 inches and a corresponding 0.75 inch elevation (one inch of horizontal travel of drive block 66 being reduced by a 1 to 4 ratio due to the angle of inclination of like-angled inclined surfaces 72 and 74). At this point, tray support elements 50 are again extended to support the next lowermost tray 200 in the tray stack as shown in FIG. 5. Air cylinder 62 may then be actuated to positively drive shaft 64 to the left, followed by leftward movement of already actuated drive block 66 to return lift structure 78 to its lowermost position as shown in FIG. 7.

Figure 17A:
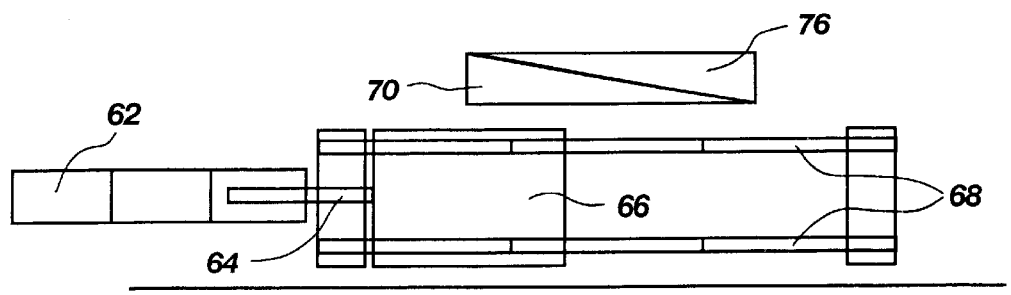
FIGS. 17A–D are schematic representations of tray input cycle positions of a wedge-type lift mechanism usable with the invention.
Figure 17B:
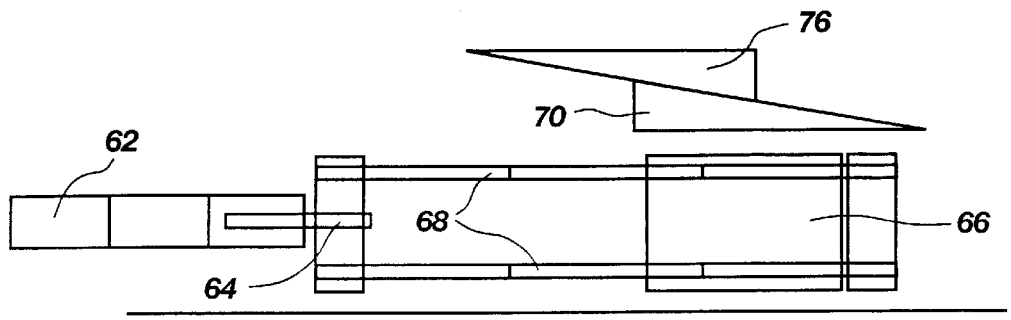
Figure 17C:
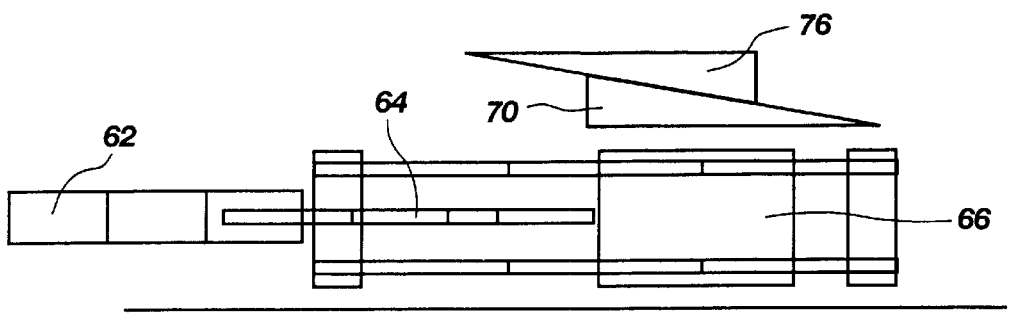
Figure 17D:
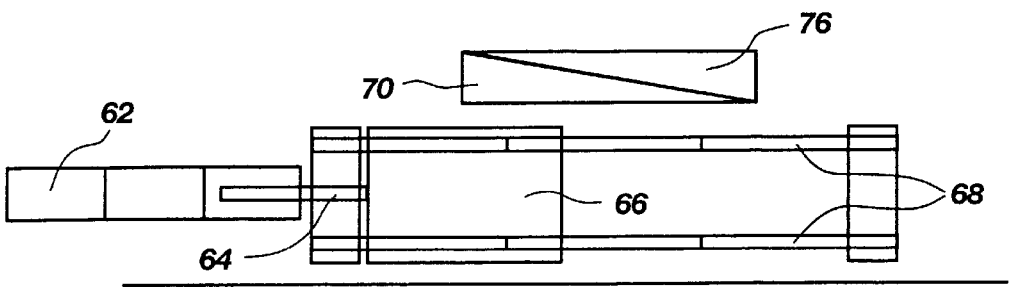

A complete tray input cycle sequence of positions of drive wedge element 70, slave wedge element 76, shaft 64, and drive block 66 of a wedge-type lift mechanism 60, usable with an input shuttle assembly 12 according to one embodiment of the present invention, is schematically depicted in FIGS. 17A–17D. Lift mechanism 60 moves from its lowermost position (FIG. 17A) to its uppermost elevation of 1.00 inch (FIG. 17B), moves downward 0.25 inch to a 0.75 inch elevation (FIG. 17C), and then moves back to its lowermost position (FIG. 17D).

It should be noted that while the elements of wedge-type lift mechanism 60 are the same when used with both input shuttle assembly 12 and output shuttle assembly 14, cylinder 62 is reversed in orientation due to space considerations and the travel of shaft 64 extending therefrom is abbreviated, as will now be explained in greater detail. When lift mechanism 60 is employed with output shuttle assembly 14, the initial raised position of lift structure 78 is at 0.75 inch, wherein the bottom of a stack of trays 200 is contacted in supporting relationship by a tray 200 of marked IC packages 202. Then, tray support elements 50 are retracted, permitting movement of lift structure 78 to a full vertical travel of 1.00 inch to lift the tray stack upwardly one tray thickness. Tray support elements 50 may then be extended to support the tray stack by the newly-added lowermost tray 200 just received from tray carrier 22.

Figure 18A:
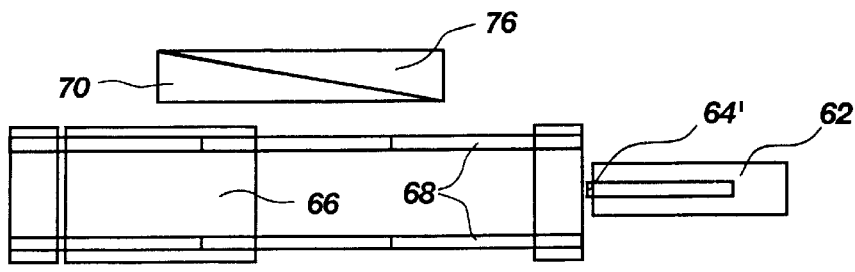
FIGS. 18A–D are schematic representations of tray output cycle positions of a wedge-type lift mechanism usable with the present invention.
Figure 18B:
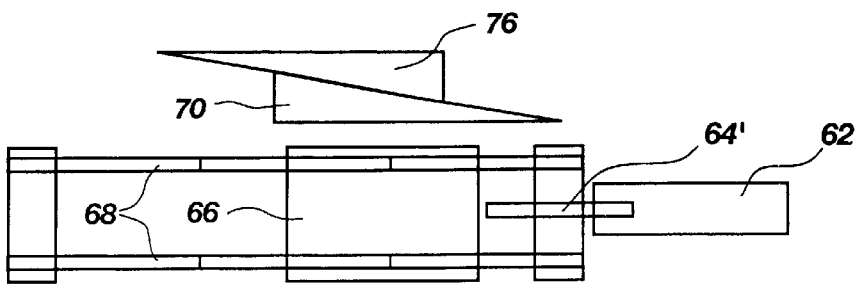
Figure 18C:
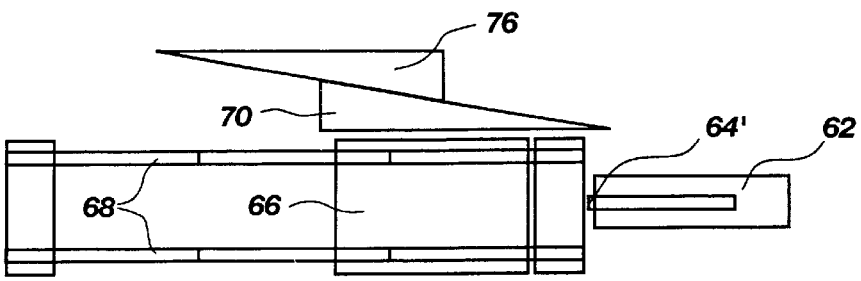
Figure 18D:
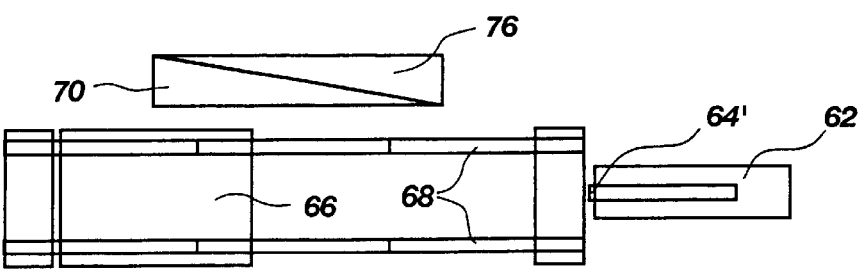

A complete tray output cycle sequence of positions of drive wedge element 70, slave wedge element 76, shaft 64', and drive block 66 of a wedge-type lift mechanism 60, usable with an output shuttle assembly 14 according to one embodiment of the present invention, is schematically depicted in FIGS. 18A–18D. As depicted in FIGS. 18A–18D, when used with an output shuttle assembly 14, the lift mechanism 60 moves from a lowermost position (FIG. 18A) to a 0.75 inch elevation position (FIG. 18B), wherein drive block 66 has moved from left to right, but its travel has been halted by contact with extended shaft 64' of air cylinder 62 which, in this instance, is placed to the right of drive block 66 rather than to the left. Since shaft 64' when extended only travels one inch, the travel of drive block 66 to the right is halted at the 0.75 inch elevation of lift mechanism 60. Shaft 64' is then retracted to the right, followed by drive block 66, causing lift mechanism 60 to reach its full vertical travel of 1.00 inch (FIG. 18C). Drive block 66 is then moved to the left (FIG. 18D).

With respect to the tray handling aspects of the invention, it may also be desirable to provide sensors to sense when tray output shuttle assembly 14 is full of trays 200 and when a tray 200 has cleared the level of tray support elements 50. Similarly, tray input shuttle assembly 12 may employ a tray-presence sensor to confirm that a tray 200 is, in fact, loaded onto tray carrier 22 and a stack-presence sensor to detect when there are no more trays 200 present to be loaded onto tray carrier 22. Fiber optic reflection-type sensors are one exemplary sensor technology which may be employed. It may also be desirable to include sensors in a lift mechanism 60 to detect positions of drive block 66 and shaft 64 or 64'. For example, the position of drive block 66 may be sensed using magnetic proximity sensors, while the extension or retraction of shaft 64 or 64' may be inductively sensed. Other types of sensors, for example, optical sensors or contact switches, might also be employed in this capacity.

Figure 10:
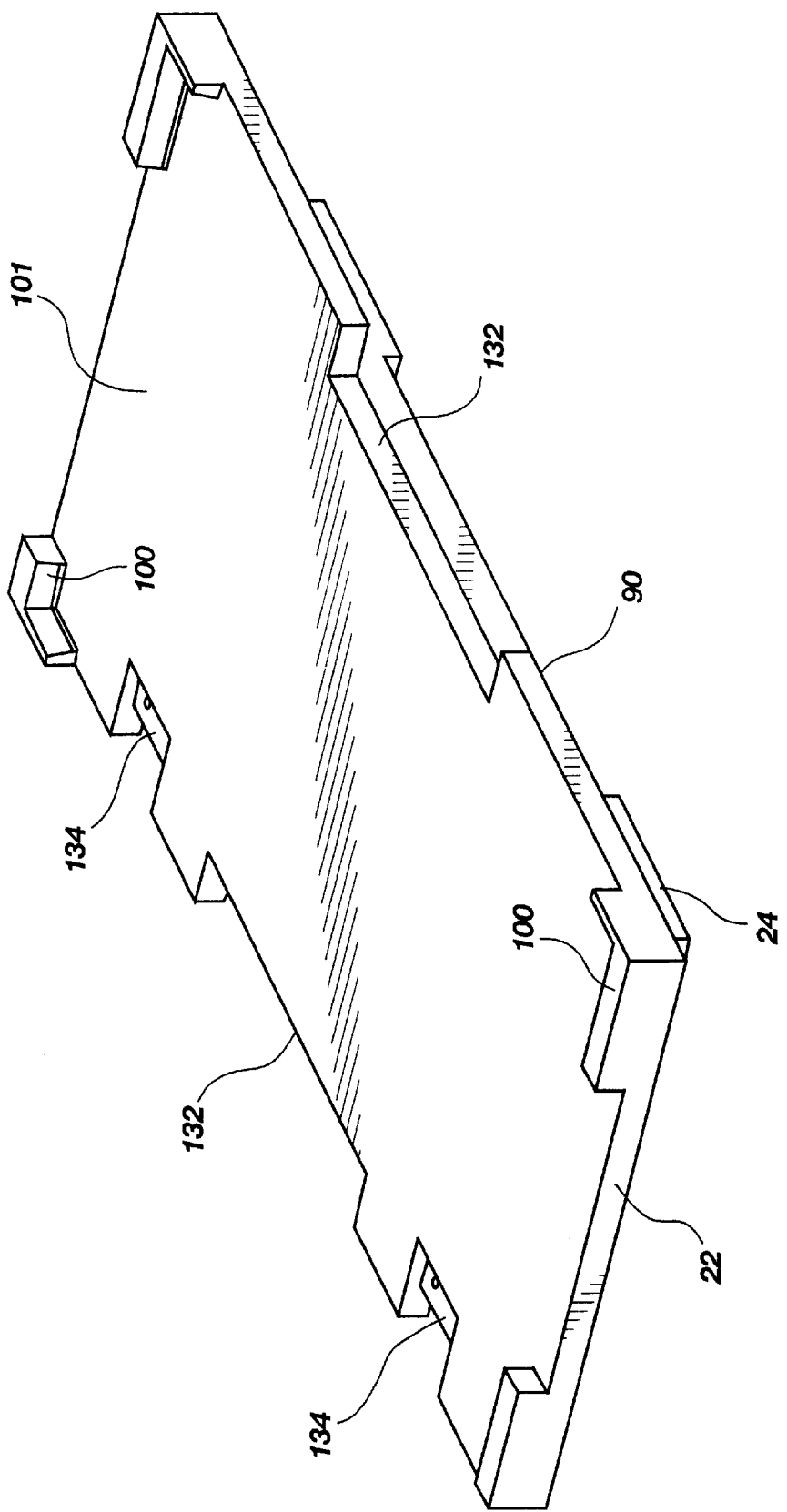
FIG. 10 is a top perspective view of a tray carrier and cooperating tray transport usable with the present invention.
Figure 11:
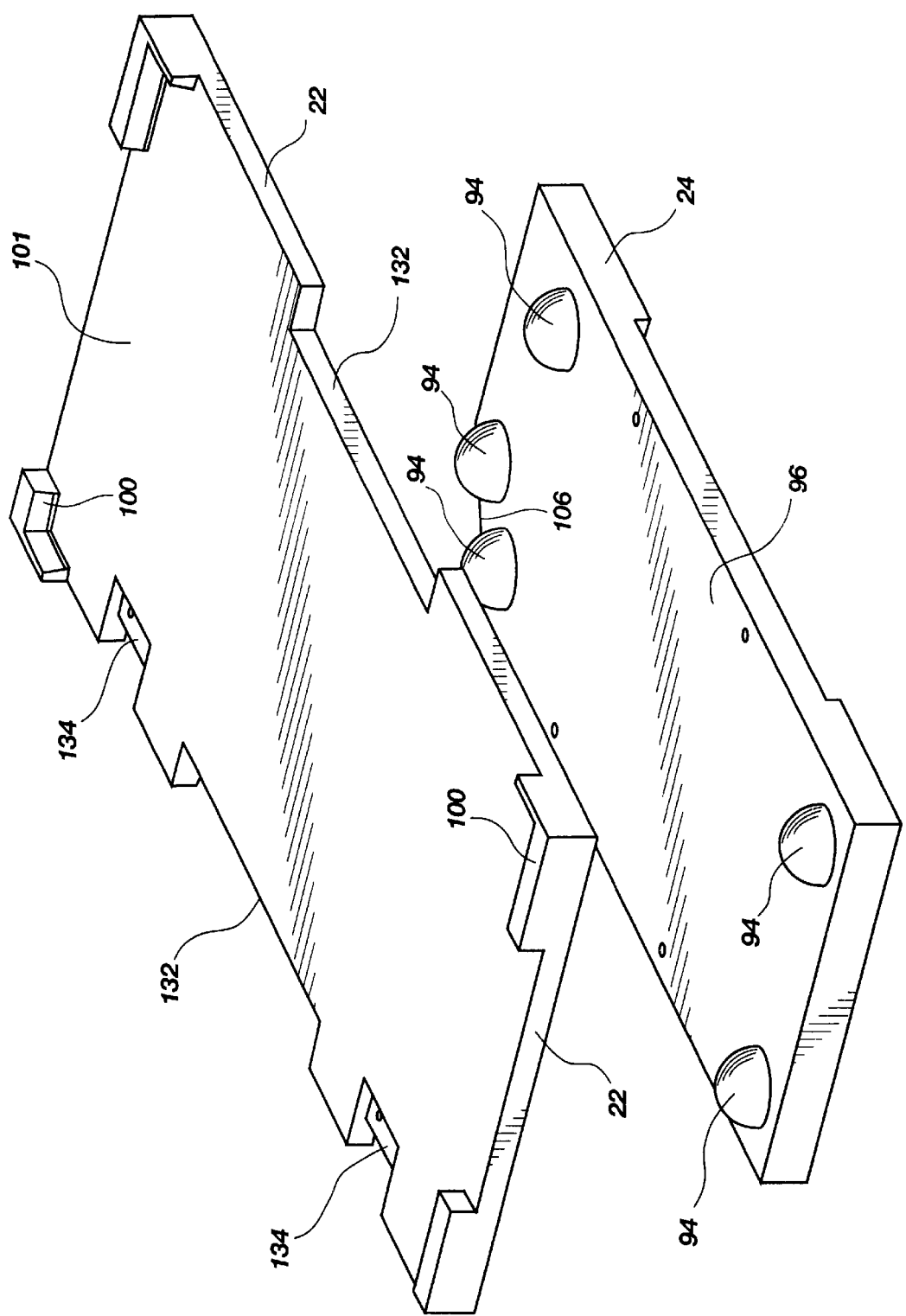
FIG. 11 is a vertically exploded view of FIG. 10.

Yet another significant feature (see FIGS. 10–12) is a self-aligning, cooperative configuration of tray carrier 22 and tray transport 24 to ensure repeatable, precise positioning of a tray 200 borne by the carrier 22 relative to input and output tray stack volumes 46, respectively, and laser marking station 18. Tray carrier 22 is lifted off of tray transport 24 by rotational lift mechanism 150 into the substantially bottomless enclosure of laser marking station 18 and then returned therefrom for transport to output shuttle assembly 14. It is imperative that tray carrier 22 be in a precise location and orientation when lifted from tray transport 24 and that it be returned to the same, precise location and orientation to provide reliable tray movement, to maintain the integrity of parts on the tray, and to ensure trouble-free operation when unloading and loading trays 200 at shuttle assemblies 12 and 14, respectively. Moreover, this precise orientational requirement must be accommodated without physical connection of the tray carrier 22 to tray transport 24. Therefore, the substantially planar lower surface 90 of tray carrier 22 is provided with a plurality of hemispherical recesses 92, which are of like radius and in the same positions as hemispherical bearings 94 projecting upwardly from substantially planar upper surface 96 of tray transport 24. This cooperative recess and bearing configuration provides robust, repeatable, gravity-enhanced alignment when the two components are mated.

Figure 12:
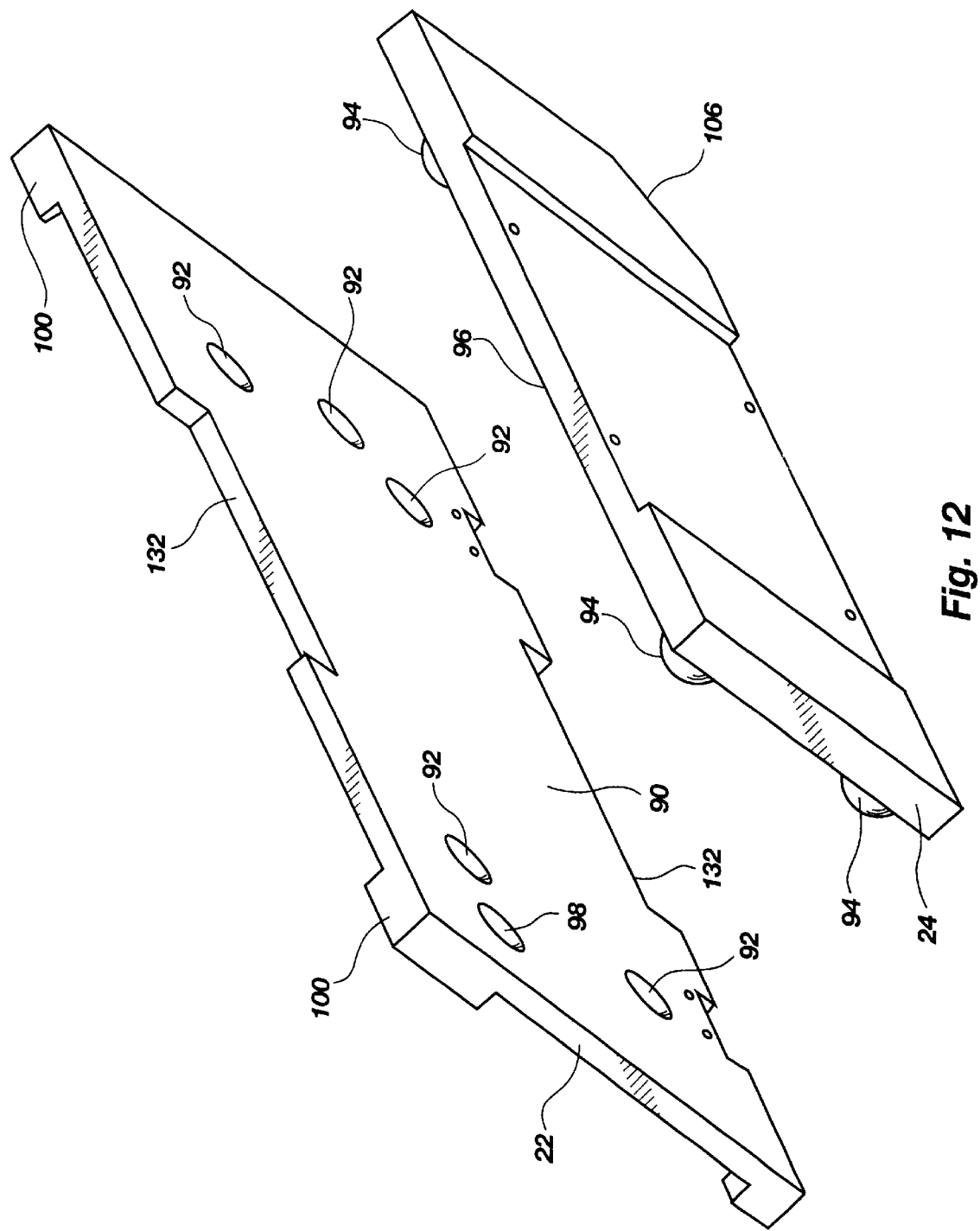
FIG. 12 is a bottom, exploded perspective view of the tray carrier and cooperating tray transport of FIG. 10.

Referring to FIG. 12 of the drawings, the reader will note the presence of an additional hemispherical recess 98 on lower surface 90 of tray carrier 22 offset from the five hemispherical recesses 92. Additional recess 98, when used with a longitudinally foreshortened (in comparison to tray carrier 22) tray transport 24 as shown in FIGS. 11–14, permits the tilting of a tray 200 on tray carrier 22 by vertical extension of a shaft 102 of an air cylinder (FIGS. 13–14), shaft 102 being surmounted by a bearing cylinder supporting a spherical bearing 104 of like radius to bearings 94 and aligned with additional recess 98. During tilting, a tray 200 is constrained against movement relative to the tray carrier 22 by corner stops 100 extending upwardly from substantially planar upper surface 101 of tray carrier 22. The two hemispherical recesses 92 most distant from, and diagonally located with respect to, additional recess 98, engaged by their cooperating bearings 94 of tray transport 24, provide a tilt pivot point or fulcrum for tilting of tray carrier 22 and the tray 200 residing therein at an angle to the longitudinal axis of the normally superimposed tray carrier 22 and tray transport 24. The tilting of tray carrier 22 and a tray 200 is further facilitated by diagonal truncation or cutout 106 of the nearby corner of tray transport 24. Tilting results in movement of each IC package 202 disposed in a tray 200 borne by the tray carrier 22 toward the same corner of the tray recess 204 in which that IC package 202 is located.

Figure 13:
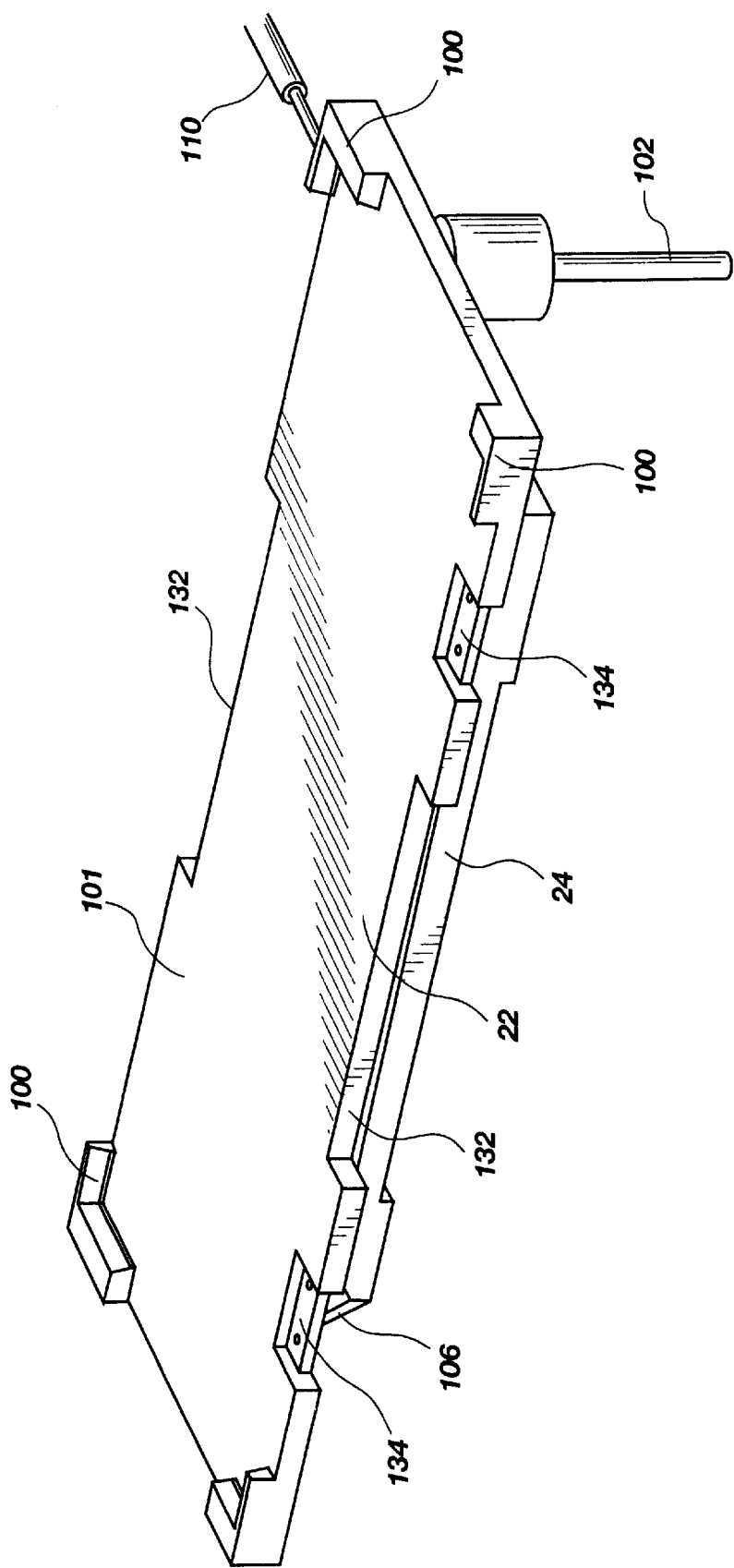
FIG. 13 is a perspective view of a tray carrier and cooperating tray transport of the present invention in a position for tilting of the tray carrier with respect to the tray transport.
Figure 14:
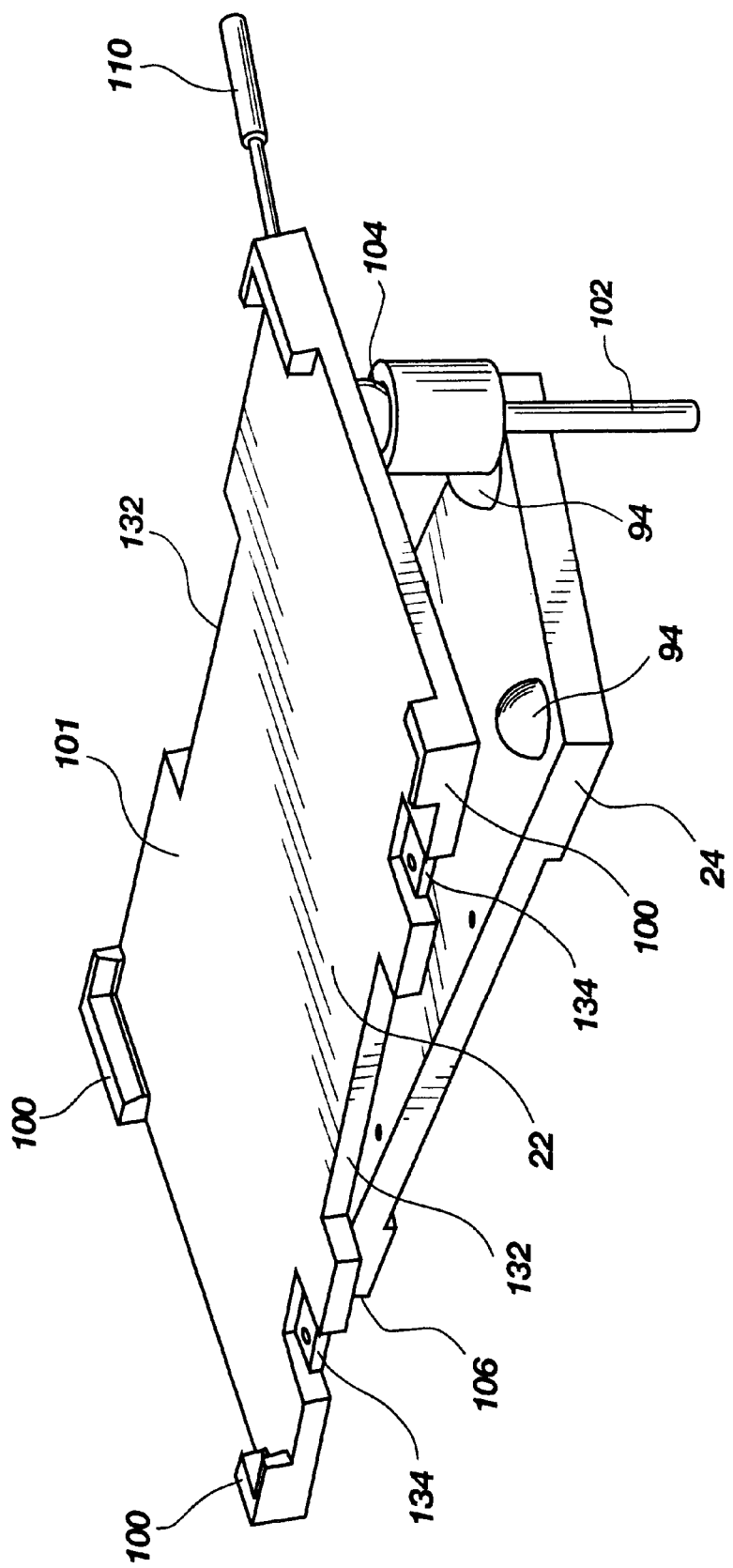
FIG. 14 is a perspective view of the tray carrier of FIG. 13, tilted with respect to the tray transport.

Also noteworthy in FIGS. 13 and 14 is the presence of part movement facilitator 110, which may comprise a vibrator, or an air cylinder actuated to repeatedly "tap" the tray carrier 22 to overcome any sliding friction preventing the IC packages 202 from moving to their desired positions. The tray tilting location (with optional part movement facilitator 110) may be at the position of tray transport 24 under the laser marking station 18 proximate rotational lift mechanism 150 to effect precise alignment of IC packages 202 immediately before marking. Alternatively, the tray tilting location (with optional part movement facilitator 110) may be at the upstream side of laser marking station 18 where tray carrier 22 passes under inspection camera 30 so that the position of each IC package 202 may be checked.

Yet another significant feature of the laser marking system of the present invention is the configuration of laser marking station 18. Specifically, laser marking station 18 employs a substantially bottomless enclosure 120 having four sides and a roof (see FIGS. 1, 2, 15, and 16) which, unlike conventional marking stations previously referenced herein, does not require opening and closing of access shutters to admit a group of IC packages to be marked. Instead, as shown in FIG. 15, a tray 200 of unmarked IC packages 202 positioned below enclosure 120 and residing on tray carrier 22, which in turn rests on tray transport 24 of transport actuator 16 (not shown in FIGS. 15 and 16 for clarity), may be raised off of tray transport 24 into the opening 122 defined in the bottom of enclosure 120 by the rotational lift mechanism 150.

Figure 15:
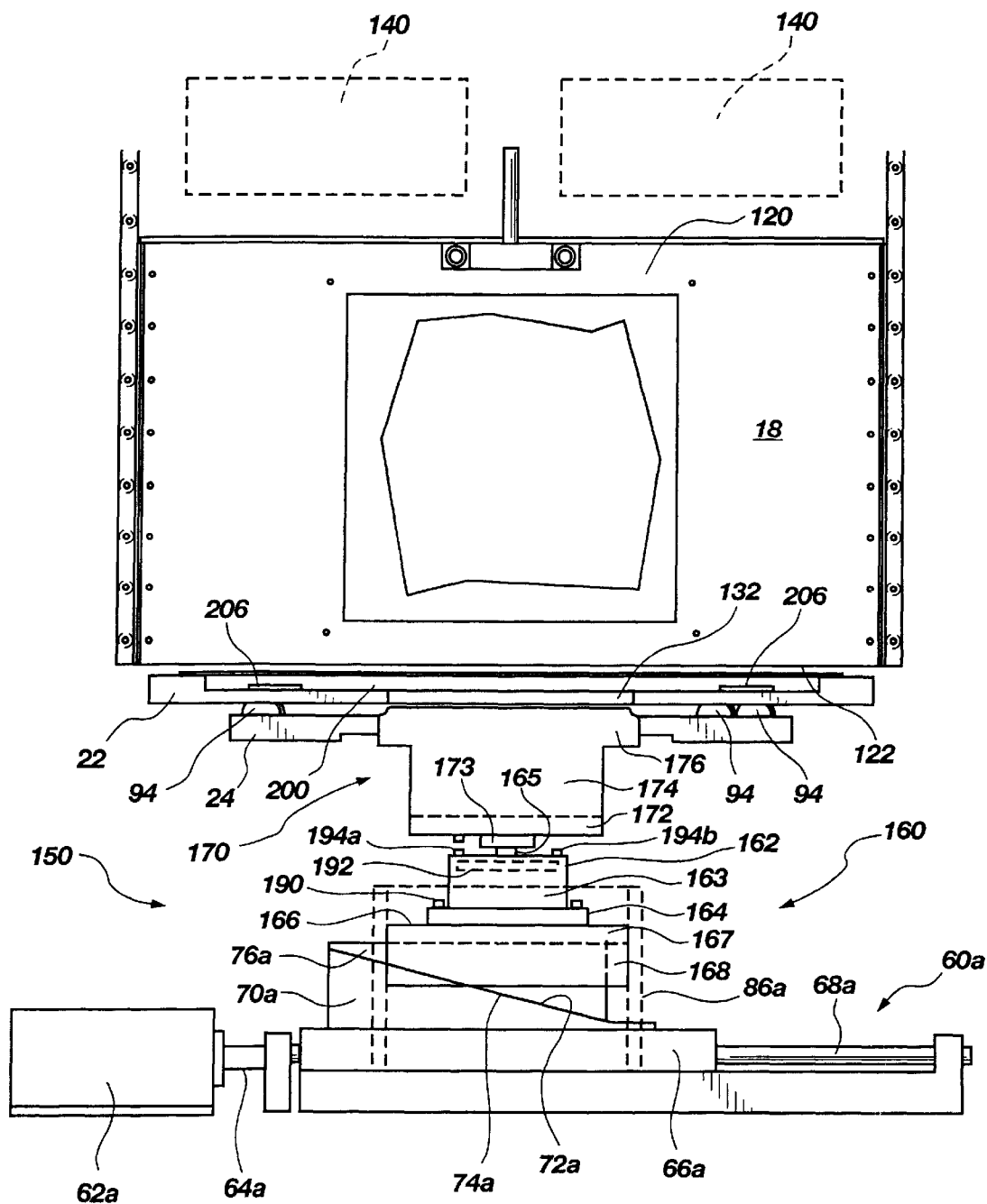
FIG. 15 is a side elevation of a laser marking station with doorless enclosure and a rotational lift mechanism according to the invention positioned to lift a tray carrier into, and to rotate the tray carrier relative to, the enclosure.
Figure 16:
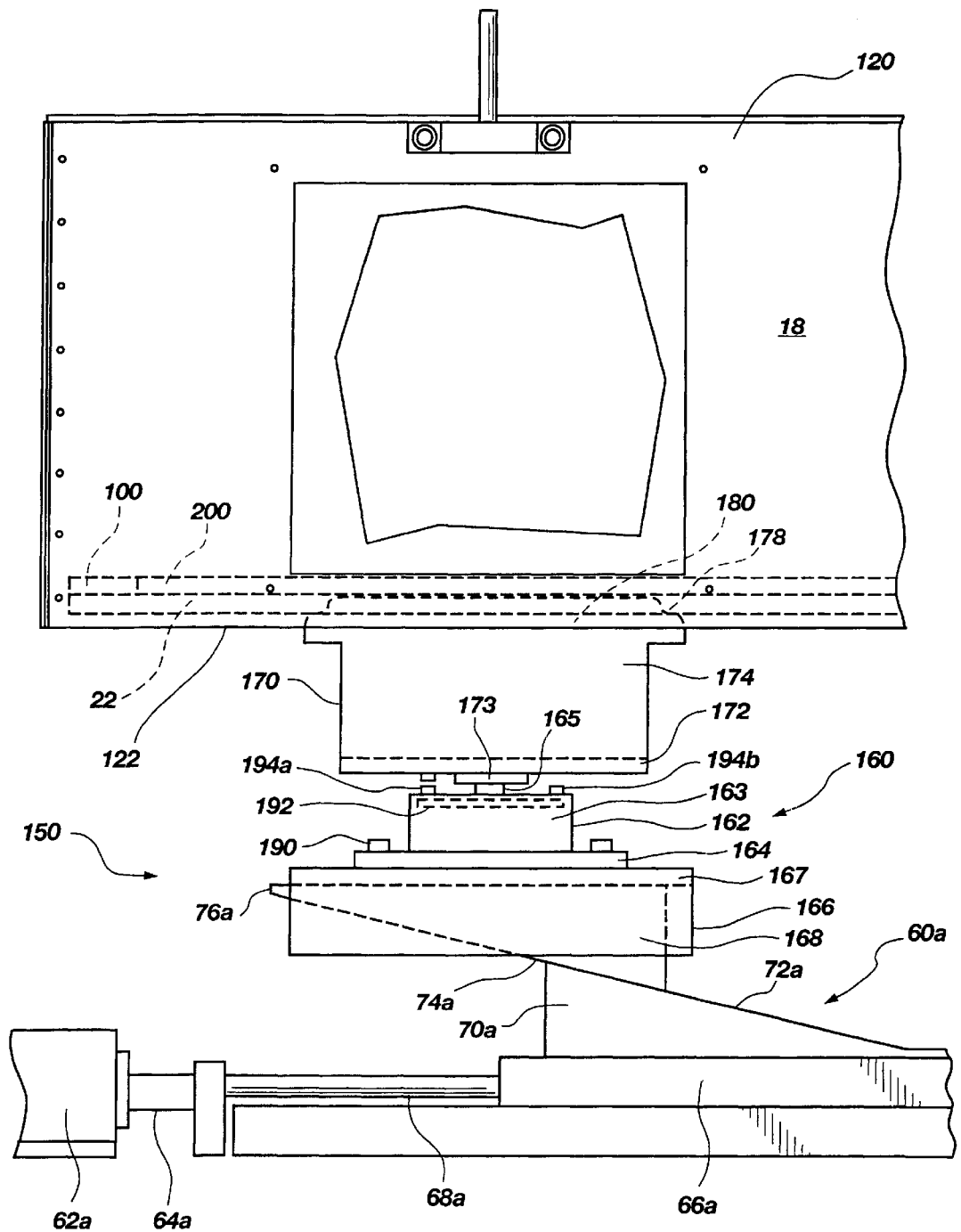
FIG. 16 is an enlarged side elevation of the apparatus depicted in FIG. 15 with the tray carrier lifted into the enclosure of the laser marking station to effect complete light containment in cooperation therewith.

In one embodiment of the present invention, as seen in FIGS. 15 and 16, rotational lift mechanism 150 is comprised of a wedge-type vertical lift mechanism 60a, a rotary actuator assembly 160, and a tray manipulator 170. The lift mechanism 60a of rotational lift mechanism 150 is substantially identical to the lift mechanisms 60 associated with the input and output shuttle assemblies 12, 14, respectively, as shown and described with respect to FIGS. 1–9. It should be understood by those of ordinary skill in the art that any other suitable vertical lifting mechanism may be employed in rotational lift mechanism 150 rather than the wedge-type lift mechanism described herein.

Lift mechanism 60a includes a pneumatically actuated drive block 66a riding on dual parallel horizontal guide shafts 68a and having drive wedge element 70a secured thereto. Upper inclined surface 72a of drive wedge element 70a slidably interfaces with lower inclined surface 74a of slave wedge element 76a. Lift mechanism 60a further includes a horizontally orientated stop dual-action air cylinder 62a having a shaft 64a. Horizontal movement of drive block 66a translates into vertical movement of rotational lift mechanism 150 by movement of the upper inclined surface 72a of drive wedge element 70a against lower inclined surface 74a of slave wedge element 76a. The angle of inclination between surfaces 72a and 74a provides reduced vertical motion (i.e., a 4:1 horizontal to vertical ratio) and increased force over the smaller vertical distance, as well as a smoother vertical movement of rotational lift mechanism 150. In a manner similar to lift mechanism 60 of the input and output shuttle assemblies 12, 14, respectively, the shaft 64a of air cylinder 62a serves as a positive stop for drive block 66a, as will be described in greater detail below.

Rotary actuator assembly 160 comprises a rotary actuator 162 and an actuator support structure 166. Actuator support structure 166 comprises a base plate 167 extending between two guide plates 168, the guide plates 168 being substantially perpendicular to the base plate 167 and secured thereto. The rotary actuator 162 may include a housing 163 having a flange 164 to facilitate attachment of the rotary actuator 162 to the base plate 167. Any suitable fastener may be used to secure the rotary actuator 162 to the base plate 167. By way of example only, threaded bolts 190 extending through holes (not shown) in the flange 164 and engaging threaded holes (not shown) in the base plate 167 may be employed to secure the rotary actuator 162 to the base plate 167. The actuator support structure 166 is secured to slave wedge element 76a and translates therewith. Threaded fasteners, adhesives, welding, or any other suitable fastening method may be used to secure the actuator support structure 166 to the slave wedge element 76a. The guide plates 168 of actuator support structure 166 are contained and guided by linear bearings 86a to restrict slave wedge element 76a, actuator support structure 166, and rotary actuator 162 to substantially vertical motion. The linear bearings 86a are shown in dashed line in FIG. 15, but have been removed from FIG. 16 for clarity.

The rotary actuator 162 may be any suitable actuator having an output shaft 165 capable of at least 180 degrees rotation. Electromagnetic actuators—such as, for example, brushless DC motors, stepper motors, servomotors, and rotary solenoids—as well as pneumatic rotational actuators and piezoelectric actuators are believed to be suitable for this purpose.

Attached to the output shaft 165 of rotary actuator 162 is the tray manipulator 170. The tray manipulator 170 comprises two parallel extensions 174 extending between and generally perpendicular to a connecting plate 172. Each parallel extension 174 of tray manipulator 170 includes an upper end 176 having a pair of notched edges 178 bracketing a central protrusion 180, the central protrusion 180 being sized and located to closely fit within elongated side notches 132 of the tray carrier 22.

The tray manipulator 170 may include a bushing 173 attached to the connecting plate 172 to facilitate attachment of the tray manipulator 170 to the output shaft 165 of rotary actuator 162. Any suitable attachment method may be used to secure the tray manipulator 170 to the output shaft 165 of rotary actuator 162. By way of example only, bushing 173 of tray manipulator 170 may be secured to the output shaft 165 using threaded fasteners, adhesives, or welding. Those of ordinary skill in the art will appreciate that the tray manipulator 170 (i.e., connecting plate 172, bushing 173, and parallel extensions 174) may comprise a single piece of material.

During a marking operation, after a tray 200 of unmarked ICs is loaded onto tray carrier 22 from input shuttle assembly 12, the tray carrier 22 bearing the tray 200 and unmarked ICs 202 travels on tray transport 24 of transport actuator 16 to a position underneath the laser marking station 18. Tray carrier 22 is aligned with respect to the bottom opening 122 of the enclosure 120 at laser marking station 18. Elongated side notches 132 of tray carrier 22 are also substantially aligned with parallel extensions 174 of tray manipulator 170.

The vertical lift mechanism 60a is then actuated, lifting the rotary actuator assembly 160 and tray manipulator 170 to engage tray carrier 22. The lateral extent or width of tray transport 24 is less than that of tray carrier 22, so that parallel extensions 174 of tray manipulator 170 pass outboard of tray transport 24, allowing central protrusions 180 of parallel extensions 174 to engage elongated side notches 132 of tray carrier 22. With the central protrusion 180 on each parallel extension 174 of the tray manipulator 170 filly engaged with a corresponding elongated side notch 132 on the tray carrier 22, the vertical lift mechanism 60a further lifts the tray carrier 22 into the bottom opening 122 of enclosure 120.

As shown in FIG. 16, when lift mechanism 60a is fully vertically extended, tray carrier 22 is substantially contained within enclosure 120 and the tray 200 is located completely within enclosure 120 at the proper focal length for laser marking with the assurance that laser light emitted from the laser marking head will be completely contained within enclosure 120. Further, tray carrier 22 is sized and shaped to act as a substantially light-tight closure to bottom opening 122 of enclosure 120. Completion of the closure is effected by the presence of parallel extensions 174 in elongated side notches 132, central protrusions 180 of parallel extensions 174 being of adequate width to fill the width of elongated side notches 132. Assurance of a light-tight enclosure 120 may be further provided with magnetic sensors on the interior of enclosure 120, which will confirm the proper location of tray carrier 22 responsive to the presence—in the proper location within enclosure 120—of two magnets 134 (see FIGS. 10–14) secured in tray carrier 22.

Once the tray carrier 22 is positioned within the enclosure 120 and the light-tight closure effected, a first portion of the ICs 202 disposed in the tray 200 supported on tray carrier 22 may be laser marked. A single laser marking head and the mark field 140 traversed thereby, is longitudinally offset to one side of the enclosure 120. All of the IC packages 202 positioned within the mark field 140 may be laser marked. For example, if the mark field 140 is 6 inches by 6 inches, all of the ICs 202 disposed in a first longitudinal half of a 12 inch by 6 inch tray are laser marked.

After laser marking of the first portion of ICs 202 located within mark field 140 is complete, the lift mechanism 60a is actuated to lower tray carrier 22 out of enclosure 120. To allow for rotational indexing of tray 200 resting on tray carrier 22, the vertical lift mechanism 60a must lower tray carrier 22 through a vertical distance sufficient to allow for rotation of tray 200 and tray carrier 22 without interference or collision with any surface of enclosure 120 of laser marking station 18. However, the lift mechanism 60a must simultaneously maintain the tray carrier 22 at a sufficient vertical elevation to enable tray carrier 22 to rotate relative to tray transport 24 without interfering or colliding therewith. The necessary vertical elevation—or clearance elevation—of lift mechanism 60a is achieved by interaction between the drive block 66a and the shaft 64a of air cylinder 62a in a manner similar to the lift mechanism 60 as shown and described with respect to FIGS. 2–9.

With the tray carrier 22 and tray 200 disposed thereon vertically positioned at the clearance elevation, the tray 200 and IC packages 202 resting therein may be rotationally indexed. Rotational indexing is effected by actuating rotary actuator 162 of rotary actuator assembly 160 to rotate the output shaft 165 through 180 degrees of rotation, either clockwise or counter-clockwise. The lift mechanism 60a is again actuated to raise the tray carrier 22 and tray 200 into the bottom opening 122 of enclosure 120 to achieve a light-tight closure as described above.

A second portion of ICs 202 disposed in the tray 200 may now be laser marked. The second portion of ICs 202 comprises those IC packages 202 now positioned within the mark field 140 of the single laser marking head. Returning to the prior example wherein the mark field 140 is 6 inches by 6 inches and the tray 200 has a 12 inch by 6 inch array of ICs 202, after rotational indexing, all of the ICs 202 disposed in a second longitudinal half of the 12 inch by 6 inch tray are laser marked. Thus, after the rotational indexing step and subsequent laser marking, all of the ICs 202 disposed in tray 200 carried on tray carrier 22 have received a laser mark.

A laser mark is applied to a surface of each IC package 202 within the mark field 140 by a laser beam originating from and controlled by the laser marking head. A laser mark can be characterized as a predetermined set of vectors, each vector including a magnitude and an orientation, wherein all of the vectors in the set define the mark. During laser marking, movement of the laser beam within the mark field 140 is controlled by a computer. To create a laser mark on an IC package 202, the computer includes a program comprised of a sequence of steps corresponding to the vectors defining the laser mark. Because a mark comprises a set of vectors and each vector includes a specific orientation, a computer program employed to laser mark the first portion of ICs 202 disposed in a tray 200 will not correctly laser mark the second portion of ICs 202 on the tray 200, as the tray 200 and the ICs 202 disposed therein are rotationally indexed prior to laser marking the second portion of ICs 202. If the tray 200 is rotationally indexed 180 degrees after laser marking the first portion of ICs 202, the second portion of ICs 202 would receive a laser mark rotationally offset by 180 degrees—or "upside down"—in relation to the laser marks applied to the first portion of ICs 202.

Thus, the sequence of steps directing movement of the laser beam within the mark field 140 during laser marking of a first portion of ICs 202 carried on a tray 200 must be modified in order to correct for the change in orientation of the IC packages 202 as a result of rotational indexing. If a primary computer program or a subroutine thereof is used to laser mark the first portion of ICs 202, a second computer program or a different subroutine of the primary program must be used to apply laser marks of correct orientation to the second portion of ICs 202 after rotational indexing. Those of ordinary skill in the art will understand that since the set of vectors defining a laser mark on one of the second portion of ICs 202 would essentially be a mirror image of a set of vectors defining a laser mark on one of the first portion of ICs 202, the addition of a second computer program or a different subroutine to compensate for rotational indexing should be relatively simple and inexpensive.

All of the IC packages 202 disposed in tray 200 having received a laser mark, the tray 200 and tray carrier 22 are lowered by lifting mechanism 60a away from the enclosure 120 until the tray carrier 22 rests upon tray transport 24. The tray 200 bearing marked IC packages 202 is then transported by the tray carrier 22 resting on tray transport 24 of transport actuator 16 to the output shuttle assembly 14. The tray 200 may, of course, be stopped at a location intermediate of laser marking station 18 and output shuttle assembly 14 for inspection.

Those of ordinary skill in the art will understand that because a tray 200 bearing ICs 202 to be marked is rotated by 180 degrees during a marking operation, the orientation of output shuttle assembly 14 is opposite the orientation of input shuttle assembly 12. In other words, the "keyed" orientation of trays 200 stacked in input shuttle assembly 12 as described above is opposite (rotated by 180 degrees) of the "keyed" orientation of trays 200 stacked in the output shuttle assembly 14.

It should be noted that in some circumstances it may be desirable to maintain the same "keyed" orientation at both the input and output shuttle assemblies 12, 14. For example, it may be necessary to receive trays 200 at the output shuttle assembly 14 in the same rotational orientation as the trays 200 are supplied to the input shuttle assembly 12 so that the laser marking system 10 can interact with other automated tray-based handling and processing equipment. Consistent tray orientation may be maintained along the entire path of transport actuator 16 by employing an additional rotation step or rotational correction. After the second portion of ICs 202 has been laser marked, the tray carrier 22 and tray 200 resting thereon may be lowered by vertical lift mechanism 60*a* to the clearance elevation, the clearance elevation being maintained by the action of shaft 64*a* of air cylinder 62*a* on drive block 66*a*. While at the clearance elevation, the rotary actuator 162 of rotary actuator assembly 160 may again be actuated to rotate the output shaft 165—again, either clockwise or counter-clockwise—through 180 degrees of rotation, thereby repositioning the tray 200 to its original orientation. Once rotational correction is complete and the tray 200 borne on tray carrier 22 is positioned in its original rotational orientation, the tray carrier 22 may be lowered onto tray transport 24 and the process continued as previously described. It should be noted that if the tray carrier 22 and tray 200 disposed thereon are rotated in the same direction (either clockwise or counter-clockwise) during both rotational indexing and rotational correction, a rotary actuator 162 capable of a full 360 degrees of rotation is required.

Precise angular positioning during rotational indexing, as well as rotational correction, may be achieved using a variety of sensor configurations and control methods. For example, in one embodiment, a closed-loop control system may be used in conjunction with sensors to detect the relative position of tray manipulator 170. For example, an optical encoder 192 may be used to track rotation of output shaft 165 of the rotational actuator 162. The optical encoder 192 may be integral to the housing 163 of rotary actuator 162 as shown in FIG. 15 or may be external to the rotary actuator 162. Any other suitable rotary sensor, such as, a rotary magnetic encoder or a brushless resolver, may be used to measure the rotation of output shaft 165. Alternatively, proximity sensors may be used to track discrete positions of the tray manipulator 170. For example, a home position sensor 194*a* may be used to determine if the tray manipulator 170 is at the home or nonrotated position. One or more additional proximity sensors 194*b* may be used to determine if the tray manipulator 170 has been rotated a specific angle, such as an angle of 180 degrees. The proximity sensors 194*a*, 194*b* may be noncontact-type proximity sensors such as, by way of example only, optical, capacitive, inductive, or magnetic type proximity sensors. Alternatively, contact-type proximity sensors may be used. It will be understood by those of ordinary skill in the art that, as an alternative to sensing the rotational position of the tray manipulator 170, sensors may be employed to directly sense the rotational position of the tray carrier 22 or a tray 200.

In another embodiment, an open-loop control system may be used to control the relative position of tray manipulator 170. Open-loop control may be achieved using a stepper motor as the rotary actuator 162 in conjunction with a motor controller. To position tray manipulator 170, and hence the tray carrier 22 and a tray 200 residing thereon, the motor controller simply sends a command signal (comprised of a series of electrical pulses) to the stepper motor to actuate the stepper motor through a pre-determined number of steps. By way of example, for a stepper motor having 90 steps per revolution (i.e., 4 degrees per step) wherein the desired total rotation is 180 degrees, the motor controller would send a command signal to the stepper motor corresponding to 45 steps. In response to the command signal, the stepper motor will actuate through 45 steps to rotate the output shaft 165 and tray manipulator 170 through 180 degrees. The relative positions of the output shaft 165 or tray manipulator 170 are, however, not otherwise sensed using any type of sensor.

Those of ordinary skill in the art will appreciate the many advantages of employing rotational indexing at the laser marking station 18. All of the IC packages 202 carried in a tray 200 may be efficiently laser marked using a low-cost, single laser marking head traversing only one mark field 140. The transport actuator 16 is not required to longitudinally index the tray carrier 22 during a laser marking operation, as all ICs 202 disposed in a tray 200 may be laser marked in the mark field 140 by rotationally indexing the tray 200 with rotary actuator assembly 160 and tray manipulator 170. Because only a single 180 degree rotation of the output shaft 165 of a rotary actuator 162 is required (although an additional 180 degree rotation may be desirable for rotational correction), rotational indexing provides high-speed handling of a plurality of unmarked IC packages 202 carried in a tray 200. Also, precise orientation of a tray 200, and the IC packages disposed therein, relative to the laser marking head may be maintained using either an open-loop or a closed-loop control system.

While the present invention has been described in the context of an illustrated embodiment, those of ordinary skill in the art will recognize and appreciate that it is not so limited. Specifically and without limitation, additions or modifications to, or deletions from the apparatus of the invention and its operation as described may be made without departing from the scope of the invention as defined by the claims appended hereto. In addition, various elements and subassemblies of the overall system of the present invention as disclosed, individually and in various combinations, are included within the ambit of the present invention.

What is claimed is:

1. An apparatus for laser marking IC packages carried in trays, comprising:

a laser marking station;

a tray handling device configured to transport trays bearing IC packages to a location proximate said laser marking station for laser marking; and a rotational indexing mechanism disposed adjacent said laser marking station configured to rotate a tray bearing IC packages positioned at said location about an axis transverse to a plane of said tray.

2. The apparatus of claim 1, wherein said rotational indexing mechanism is further configured to position said tray bearing IC packages positioned at said location at a laser focal length for laser marking.

3. A laser marking apparatus for laser marking IC packages carried in trays, each of said trays configured to support a generally planar array of IC packages, said apparatus comprising:

a laser marking head having a mark field;

a tray handling device configured to supply a tray bearing an array of IC packages to said laser marking head and to position a first portion of said array of IC packages in said mark field for laser marking; and a rotational indexing mechanism disposed proximate said laser marking head configured to rotate said tray bearing an array of IC packages to position a second portion of said array of IC packages in said mark field for laser marking.

4. The apparatus of claim 3, wherein said rotational indexing mechanism is further configured to move said tray bearing an array of IC packages to position said IC packages at a laser focal length for laser marking.

5. The apparatus of claim 3, wherein said tray handling device comprises:

a transport device defining a generally horizontal tray path having a first end and an opposing second end, a portion of said tray path between said first end and said second end positioned adjacent said laser marking head;

a tray input device disposed at said first end of said tray path configured to supply trays bearing an array of IC packages to said transport device for marking, said tray input device having a keying structure configured to supply said trays in a keyed orientation; and a tray output device disposed at said second end of said tray path configured to receive trays bearing an array of IC packages from said transport device after marking, said tray output device having a keying structure configured to receive said trays in a keyed orientation.

6. The apparatus of claim 5, wherein said keyed orientation of said tray input device is opposite said keyed orientation of said tray output device.

7. The apparatus of claim 3, wherein:

said first portion of said array of IC packages comprises one half of said array of IC packages and said second portion of said array of IC packages comprises another half of said array of IC packages; and said rotational indexing mechanism is further configured to rotate said tray bearing an array of IC packages 180 degrees to effect said positioning of said second portion of said array of IC packages in said mark field for laser marking.

8. A system for marking IC packages carried in trays, comprising:

a transport actuator defining a horizontal path;

a tray transport secured to said transport actuator and movable thereon along said horizontal path;

a tray carrier carried by, and unsecured to, said tray transport for receiving trays of IC packages;

an input shuttle assembly for providing trays of IC packages to said tray carrier;

an output shuttle assembly for receiving trays of IC packages from said tray carrier;

a laser marking station disposed adjacent a portion of said transport actuator between said input shuttle assembly and said output shuttle assembly; and a rotational lift mechanism disposed proximate said laser marking station configured to lift said tray carrier off said tray transport and to rotate said tray carrier.

9. The system of claim 8, wherein said rotational lift mechanism comprises:

a vertical lift mechanism configured for extension and retraction in a vertical direction relative to said horizontal path of said transport actuator;

a rotary actuator assembly secured to said vertical lift mechanism; and a tray manipulator secured to said rotary actuator assembly configured to engage said tray carrier.

10. The system of claim 9, wherein said vertical lift mechanism comprises:

a horizontally movable drive wedge element having an inclined upper surface;

a dual-action drive mechanism configured to horizontally move said drive wedge element;

a dual-action stop mechanism configured and located to selectively limit travel of said drive wedge element;

a vertically movable slave wedge element having an inclined lower surface of like angle of inclination to said inclined upper surface of said drive wedge element, said slave wedge element having said rotary actuator assembly secured thereto; and at least one linear bearing configured to horizontally constrain said slave wedge element and said rotary actuator assembly, permitting movement of said slave wedge element and said rotary actuator assembly substantially only in said vertical direction.

11. The system of claim 10, wherein said dual-action drive mechanism comprises a pneumatically actuated drive block to which said drive wedge element is mounted, said drive block being slidable on at least one guide shaft.

12. The system of claim 10, wherein said dual-action stop mechanism comprises a dual-action air cylinder adjacent said drive block and having a horizontally extendable and retractable shaft.

13. The system of claim 9, wherein said rotary actuator assembly comprises:

an actuator support structure secured to said vertical lift mechanism and including two substantially parallel guide plates extending between a base plate, each of said parallel guide plates constrained and guided by a linear bearing to restrict said each guide plate to movement in said vertical direction; and a rotary actuator secured to said base plate and having an output shaft capable of at least 180 degrees of rotation.

14. The system of claim 13, wherein said rotary actuator is selected from a group consisting of electromagnetic actuators, piezoelectric actuators, and pneumatic actuators.

15. The system of claim 14, wherein said rotary actuator comprises a stepper motor configured for open-loop control.

16. The system of claim 13, wherein said rotary actuator includes a housing having a mounting flange.

17. The system of claim 16, wherein said rotary actuator includes a rotary position sensor associated with said housing.

18. The system of claim 9, wherein said tray manipulator comprises:

two substantially parallel extensions, each of said parallel extensions configured to engage an elongated side notch on said tray carrier; and a connecting plate extending between and generally perpendicular to said two parallel extensions, said connecting plate configured for attachment to said rotary actuator assembly.

19. The system of claim 18, wherein each of said two parallel extensions includes an upper end having opposing notched edges, said opposing notched edges bracketing a central protrusion sized and located to closely mate with one of said elongated side notches on said tray carrier.

20. The system of claim 18, further comprising a bushing disposed on said connecting plate configured for said attachment to said rotary actuator assembly.

21. The system of claim 9, further comprising at least one sensor configured to sense a relative angular position of said tray manipulator.

22. The system of claim 21, wherein said at least one sensor is selected from a group consisting of rotary position sensors, non-contact proximity sensors, and contact-type proximity sensors.

23. The system of claim 8, wherein said input shuttle assembly and said output shuttle assembly each comprises:

a frame defining a vertical, rectangular tray stack volume of like length and width dimension to trays receivable in said tray carrier, said frame comprising four frame members, each of said four frame members including a vertically extending notch defining a corner of said tray stack volume, wherein said notches of two of said frame members differ in depth from said notches of another two of said frame members, and said frame members are spaced so that, in combination with said differing notch depths, said frame is adapted to receive trays in only one rotational orientation;

a plurality of tray support element actuators, one tray support element actuator of said plurality of tray support element actuators secured to each of said four frame members; and a tray support element associated with each of said one tray support element actuators, each of said tray support elements biased inwardly towards said tray stack volume and extendable therefrom by said associated tray support element actuator.

24. The system of claim 23, wherein said tray support element actuators comprise air cylinders.

25. The system of claim 23, wherein said one rotational orientation of said output shuttle assembly is opposite said one rotational orientation of said input shuttle assembly.

26. The system of claim 8, further comprising:

mutually cooperative physical structures disposed on an upper surface of said tray transport and a lower surface of said tray carrier adapted to align said tray carrier on said tray transport, wherein portions of said mutually cooperative physical structures provide a fulcrum for tilting of said tray carrier with respect to said tray transport;

a cutout formed on said tray transport, wherein said tray transport is generally rectangular in shape and said cutout comprises a corner severed therefrom proximate said fulcrum; and a lifting device extendable from a location below said tray carrier and adjacent a longitudinal end of said tray transport to contact said tray carrier at a location remote from said fulcrum, wherein said tray transport is of lesser longitudinal extent that said tray carrier.

27. The system of claim 26, wherein said mutually cooperative physical structures comprise:

a plurality of substantially hemispherical protrusions extending upwardly from an upper surface of said tray transport; and a plurality of substantially hemispherical recesses extending into a lower surface of said tray carrier located and sized to receive at least portions of said substantially hemispherical protrusions.

28. The system of claim 27, further comprising:

an additional substantially hemispherical recess disposed on said lower surface of said tray carrier at a location beyond a longitudinal extent of said tray transport and proximate a longitudinal end of said tray transport opposite said cutout of said tray transport;

an element extendable upwardly from said lifting device to engage said additional substantially hemispherical recess, said element including a substantially spherical protrusion on an end sized to be received in said additional substantially hemispherical recess, wherein said element is extendable to a degree to lift said tray carrier at said location of said additional substantially hemispherical recess.

29. The system of claim 28, wherein said lifting device comprises an air cylinder having said element extendable upwardly therefrom.

30. The system of claim 26, further comprising a part movement facilitator located for contact with said tray carrier when said tray carrier is in a tilted position.

31. The system of claim 30, wherein said part movement facilitator is selected from a group consisting of a vibrator and a device configured for intermittent contact with said tray carrier.

32. The system of claim 8, further comprising:

a vertically extendable and retractable lift mechanism located within a tray stack volume of said input shuttle assembly and configured to engage and vertically move a tray located in said tray stack volume; and a vertically extendable and retractable lift mechanism located within a tray stack volume of said output shuttle assembly and configured to engage and vertically move a tray located in said tray stack volume;

wherein said horizontal path of said transport actuator extends from said tray stack volume of said input shuttle assembly to said tray stack volume of said output shuttle assembly.

33. The system of claim 32, wherein said lift mechanism of said input shuttle assembly and said lift mechanism of said output shuttle assembly each comprises:

a horizontally movable drive wedge element having an inclined upper surface;

a dual-action drive mechanism configured to horizontally move said drive wedge element;

a dual-action stop mechanism configured and located to selectively limit travel of said drive wedge element;

a vertically movable slave wedge element having an inclined lower surface of like angle of inclination to said inclined upper surface of said drive wedge element;

a linear bearing configured to horizontally constrain said slave wedge element permitting substantially only vertical movement thereof; and a lift structure secured to said slave wedge element and extending upwardly therefrom including two substantially parallel side plates laterally spaced a greater distance than a width of said tray transport and laterally spaced a greater distance than a portion of reduced width of said tray carrier.

34. The system of claim 33, wherein said dual-action drive mechanism comprises a pneumatically actuated drive block to which said drive wedge element is mounted, said drive block being slidable on at least one guide shaft.

35. The system of claim 33, wherein said dual-action stop mechanism comprises a dual-action air cylinder adjacent said drive block and having a horizontally extendable and retractable shaft.

36. The system of claim 8, wherein the laser marking station comprises:

a substantially bottomless enclosure located above the transport actuator; and a single laser marking head housed within said enclosure and having a mark field.

37. The system of claim 36, wherein said tray carrier is sized and shaped to substantially correspond to an opening in said substantially bottomless enclosure of said laser marking station so as to provide a substantially light-safe closure for said opening when inserted thereinto.

38. The system of claim 37, further comprising:

a reduced width portion on said tray carrier defined by mutually longitudinally coextensive elongated notches in parallel sides thereof; and two substantially parallel extensions extending upwardly from said rotational lift mechanism configured to engage said tray carrier at said reduced width portion, each of said two parallel extensions being sized to substantially prevent light leakage from said enclosure in a vicinity of said reduced width portion of said tray carrier.

39. The system of claim 37, further including at least one sensor associated with said enclosure for confirming presence of said tray carrier within said opening of said enclosure in a position effecting said substantially light-safe closure.

40. The system of claim 39, wherein said at least one sensor is responsive to a magnetic element located on said tray carrier.

41. The system of claim 8, further comprising at least one inspection camera located between said input shuttle assembly and said laser marking station.

42. The system of claim 8, further comprising at least one inspection camera located between said laser marking station and said output shuttle assembly.

43. The system of claim 8, further comprising:
an inspection camera located between said input shuttle assembly and said laser marking station; and
another inspection camera located between said laser marking station and said output shuttle assembly.

44. The system of claim 8, wherein said tray carrier is substantially rectangular and includes a substantially planar upper surface having upwardly-extending stops at each corner thereof configured for at least partially restricting movement of a tray disposed on said upper surface of said tray carrier.

45. A method of laser marking a plurality of IC packages carried in a tray located adjacent a laser marking head, comprising:
positioning a first portion of said plurality of IC packages in a mark field of said laser marking head;
laser marking said first portion of said plurality of IC packages;
rotating said tray to position a second portion of said plurality of IC packages in said mark field; and
laser marking said second portion of said plurality of IC packages.

46. The method of claim 45, wherein:
said first portion of said plurality of IC packages comprises IC packages carried in one longitudinal half of said tray and said second portion of said plurality of IC packages comprises IC packages carried in another longitudinal half of said tray; and
said rotating said tray to position said second portion of said plurality of IC packages in said mark field comprises rotating said tray approximately 180 degrees.

47. The method of claim 46, further comprising rotating said tray another approximately 180 degrees after said laser marking of said second portion of said plurality of IC packages.

48. The method of claim 45, further comprising positioning said tray at a laser focal length.

49. A method of laser marking IC packages carried in trays, comprising:
transporting a tray bearing IC packages to a location adjacent a laser marking head;
positioning a first portion of said IC packages in a mark field of said laser marking head;
laser marking said first portion of IC packages;
rotating said tray to position a second portion of said IC packages in said mark field;
laser marking said second portion of IC packages; and
transporting said tray bearing IC packages away from said laser marking head.

50. The method of claim 49, further comprising positioning said tray bearing IC packages at a laser focal length.

51. The method of claim 49, wherein:
said transporting a tray bearing IC packages to a location adjacent said laser marking head comprises transporting said tray in a first tray orientation; and
said transporting said tray bearing IC packages away from said laser marking head comprises transporting said tray in a second tray orientation opposite said first tray orientation.

52. The method of claim 51, further comprising:
supplying said tray bearing IC packages from a stack of trays bearing IC packages keyed to said first tray orientation; and
receiving said tray bearing IC packages into a stack of trays bearing IC packages keyed to said second tray orientation.

53. The method of claim 49, further comprising inspecting said IC packages prior to said laser marking said first portion of IC packages.

54. The method of claim 49, further comprising inspecting said IC packages after said laser marking said second portion of IC packages.

55. The method of claim 49, wherein each of said IC packages disposed in said tray bearing IC packages is disposed in a tray cell, and further comprising tilting said tray bearing IC packages to align said each IC package to a common corner of a respective one of said tray cells.

56. The method of claim 55, further comprising tapping said tray to overcome friction between said each IC package and said respective tray cell.

* * * * *